(12) United States Patent
Kanemura et al.

(10) Patent No.: US 8,354,706 B2
(45) Date of Patent: Jan. 15, 2013

(54) SEMICONDUCTOR MEMORY DEVICE

(75) Inventors: Takahisa Kanemura, Yokohama (JP);
Tomomi Kusaka, Yokohama (JP);
Takashi Izumida, Yokohama (JP);
Masaki Kondo, Kawasaki (JP);
Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 402 days.

(21) Appl. No.: 12/719,193

(22) Filed: Mar. 8, 2010

(65) Prior Publication Data

US 2011/0121381 A1    May 26, 2011

(30) Foreign Application Priority Data

Nov. 25, 2009    (JP) .................................. 2009-267236

(51) Int. Cl.
*H01L 29/788* (2006.01)
(52) U.S. Cl. ................ 257/321; 257/E29.304
(58) Field of Classification Search .................. 257/321, 257/E29.304
See application file for complete search history.

(56) References Cited

U.S. PATENT DOCUMENTS

| | | | | |
|---|---|---|---|---|
| 5,111,430 | A * | 5/1992 | Morie ........................... | 257/321 |
| 5,463,235 | A * | 10/1995 | Ishii .............................. | 257/321 |
| 6,943,074 | B2 * | 9/2005 | Kamiya et al. ......... | 257/E29.129 |
| 7,560,767 | B2 * | 7/2009 | Yasuda et al. .......... | 257/E29.129 |
| 2006/0245245 | A1 * | 11/2006 | Mokhlesi et al. ........ | 365/185.01 |
| 2007/0105313 | A1 * | 5/2007 | Forbes .......................... | 438/257 |
| 2008/0067577 | A1 * | 3/2008 | Wang et al. ................... | 257/321 |
| 2009/0014774 | A1 * | 1/2009 | Ono ...................... | 257/E29.309 |

FOREIGN PATENT DOCUMENTS

| | | |
|---|---|---|
| JP | 2001-24077 | 1/2001 |
| JP | 2007-250974 | 9/2007 |
| JP | 2009-141354 | 6/2009 |
| KR | 10-0676204 | 1/2007 |
| KR | 10-0863366 | 10/2008 |
| KR | 10-0885797 | 2/2009 |

OTHER PUBLICATIONS

U.S. Appl. No. 12/644,821, filed Dec. 22, 2009, Nobutoshi Aoki, et al.
Ashawant Gupta et al., "Accurate Determination of Ultrathin Gate Oxide Thickness and Effective Polysilicon Doping of CMOS Devices", IEEE Electron Device Letters, vol. 18, No. 12, Dec. 1997, pp. 580-582.
I.C. Chen et al., "Substrate Hole Current and Oxide Breakdown", Applied Physics Letter, vol. 49, No. 11, Sep. 15, 1986, pp. 669-671.
Office Action issued Jun. 28, 2011, in Korean Patent Application No. 10-2010-24200 with English translation.
U.S. Appl. No. 12/719,420, filed Mar. 8, 2010, Izumida, et al.

* cited by examiner

*Primary Examiner* — Matthew Landau
*Assistant Examiner* — Sun M Kim
(74) *Attorney, Agent, or Firm* — Oblon, Spivak, McClelland, Maier & Neustadt, L.L.P.

(57) ABSTRACT

A semiconductor memory device according to an embodiment of the present invention includes a substrate, a first gate insulator formed on the substrate and serving as an F-N (Fowler-Nordheim) tunneling film, a first floating gate formed on the first gate insulator, a second gate insulator formed on the first floating gate and serving as an F-N tunneling film, a second floating gate formed on the second gate insulator, an intergate insulator formed on the second floating gate and serving as a charge blocking film, and a control gate formed on the intergate insulator, at least one of the first and second floating gates including a metal layer.

17 Claims, 12 Drawing Sheets

SEMICONDUCTOR MEMORY DEVICE

CROSS REFERENCE TO RELATED APPLICATION

This application is based upon and claims the benefit of priority from the prior Japanese Patent Application No. 2009-267236, filed on Nov. 25, 2009, the entire contents of which are incorporated herein by reference.

BACKGROUND

A cell transistor in a conventional NAND flash memory includes a tunneling insulator, a floating gate, an IPD (Inter Poly-Si Dielectric) film, and a control gate which are stacked in this order on an active area of a substrate. In general, the active area, the tunneling insulator, the floating gate, the IPD film, and the control gate are respectively formed of $p^-$-silicon, silicon oxide, $n^+$-polysilicon, silicon oxynitride, and $n^+$-polysilicon.

When the cell transistor is miniaturized, a short channel effect and adjacent cell interference can be effectively restrained by thinning the tunneling insulator. However, if the cell transistor is miniaturized so that the tunneling insulator is thinned to achieve a gate length shorter than 20 nm, an electric field applied to the tunneling insulator becomes extremely large when charges are retained in the floating gate. When a large electric field is applied to the tunneling insulator, the charges in the floating gate escape as a tunneling current into the substrate. In this manner, the miniaturization of the cell transistor results in degradation of charge retention characteristics of the cell transistor.

The cell transistor is expected to have not only excellent charge retention characteristics but also a high writing speed and a high erasing speed. However, if $n^+$-doping is insufficient in the floating gate of $n^+$-polysilicon, the lower portion of the floating gate is depleted at the time of writing. With such depletion, a tunneling current as a write current cannot flow easily, and the writing speed becomes lower.

SUMMARY

An aspect of the present invention is, for example, a semiconductor memory device including a substrate, a first gate insulator formed on the substrate and serving as an F-N (Fowler-Nordheim) tunneling film, a first floating gate formed on the first gate insulator, a second gate insulator formed on the first floating gate and serving as an F-N tunneling film, a second floating gate formed on the second gate insulator, an intergate insulator formed on the second floating gate and serving as a charge blocking film, and a control gate formed on the intergate insulator, at least one of the first and second floating gates including a metal layer.

DETAILED DESCRIPTION

A conventional NAND flash memory has a problem that defects are generated in the tunneling insulator when writing and erasing are repeated a large number of times. If such defects are generated, the reverse threshold value of the cell transistor shifts, and defective insulation is caused in the tunneling insulator. As a result, the cell transistor cannot serve as a normal memory cell.

JP-A 2009-141354 discloses an example of a nonvolatile memory device including a floating gate which includes two layers. In this device, an insulating film is formed between those layers, and the insulating film has such a thickness as to enable direct tunneling. Therefore, it is difficult to retain charges in the upper layer of the floating gate.

JP-A 2007-250974 discloses an example of a nonvolatile semiconductor memory device including a plurality of floating regions. In this device, the type and the thickness of the insulating film formed between a semiconductor substrate and the floating regions are the same as the type and the thickness of the insulating film formed between the floating regions and a gate electrode (control gate). Therefore, when data is to be written in a memory cell, the same voltage is applied to those insulating films, so that charges injected from the substrate into the floating regions escape to the gate electrode.

JP-A 2001-24077 discloses an example of a method of manufacturing a flash memory cell including a floating gate in which a charge barrier layer is formed between first and second polysilicon layers.

The following is a description of embodiments of the present invention, with reference to the accompanying drawings.

First Embodiment

Figure 1:
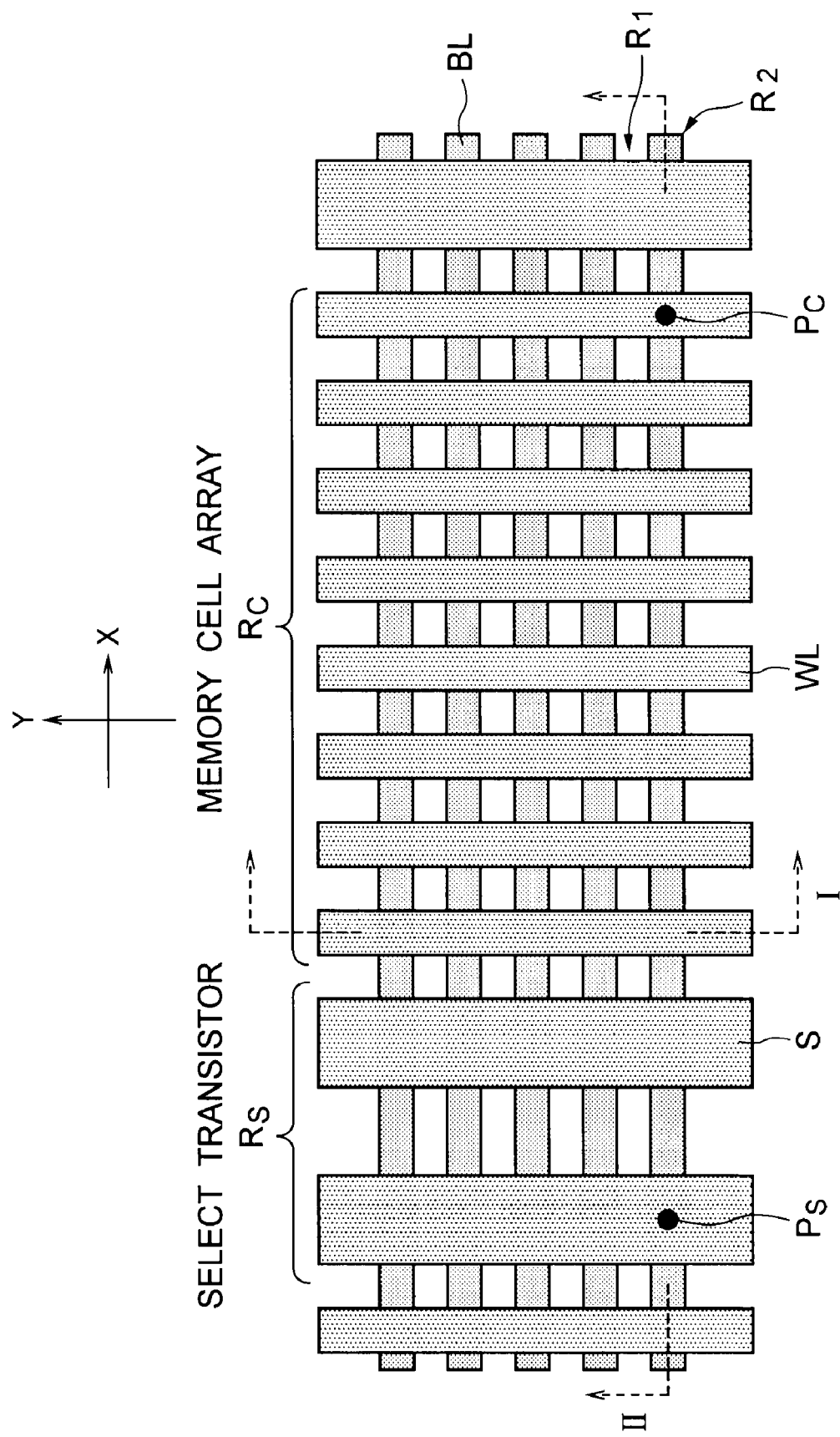
FIG. 1 is a plan view schematically showing a configuration of a semiconductor memory device according to a first embodiment.

FIG. 1 is a plan view schematically showing a configuration of a semiconductor memory device according to a first embodiment. The semiconductor memory device of FIG. 1 is an NAND flash memory.

In FIG. 1, Rc represents a memory cell array region, and Rs represents a select transistor region. FIG. 1 further shows bitlines BL extending in a first direction parallel to a surface of a substrate, and wordlines WL and selectlines S extending in a second direction parallel to the surface of the substrate.

The first and second directions are respectively represented by arrows X and Y, which are perpendicular to each other.

In the memory cell array region Rc, cell transistors (memory cells) are provided at intersection points Pc between the bitlines BL and the wordlines WL. In the select transistor region Rs, select transistors are provided at intersection points Ps between the bitlines BL and the selectlines S. Each cell transistor is electrically connected to one of the bitlines BL and one of the wordlines WL, and each select transistor is electrically connected to one of the bitlines BL and one of the selectlines S.

FIG. 1 further shows isolation regions $R_1$ and active regions (device regions) $R_2$. The isolation regions $R_1$ and the active regions $R_2$ extend in the X direction, and are provided alternately along the Y-direction in the substrate. Each of the cell transistors and the select transistors is formed on an active region $R_2$. The active regions $R_2$ in this embodiment are p⁻-regions. The active regions $R_2$ are also referred to as active areas.

Figure 2:
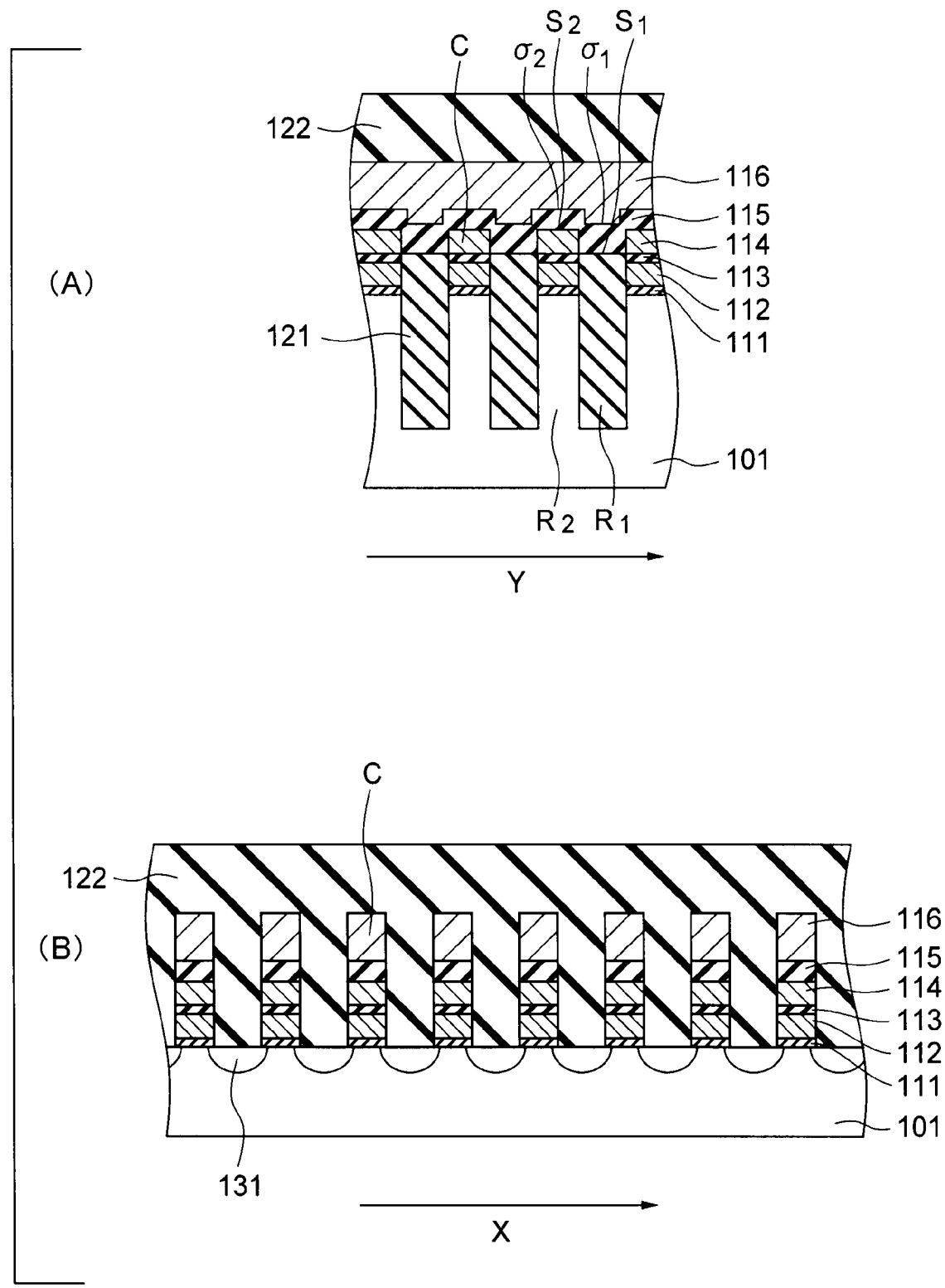
FIG. 2 illustrates cross sectional views showing a configuration of the semiconductor memory device according to the first embodiment.

FIG. 2 illustrates cross sectional views of a configuration of the semiconductor memory device according to the first embodiment.

FIG. 2(A) shows an AA (Active Area) section of the semiconductor memory device along a section line I of FIG. 1. FIG. 2(B) shows a GC (Gate Conductor) section of the semiconductor memory device along a section line II of FIG. 1. FIGS. 2(A) and 2(B) are cross sectional views of the memory cell array region Rc, and each cell transistor is represented by C.

Each cell transistor C is formed on a substrate 101, and includes a first tunneling insulator 111, a first floating gate 112, a second tunneling insulator 113, a second floating gate 114, an IPD (Inter Poly-Si Dielectric) film 115, and a control gate 116 stacked in this order on the substrate 101. The IPD film 115 may be referred to as an intergate insulator.

The substrate 101 is a semiconductor substrate such as a silicon substrate, for example. As shown in FIG. 2(A), isolation insulators 121 are formed near the surface of the substrate 101, so that the isolation regions $R_1$ and the active regions $R_2$ are formed in the substrate 101. As shown in FIG. 2(B), an inter layer dielectric 122 is formed on the substrate 101 to cover the cell transistors C, and source/drain diffusion layers 131 are formed in the substrate 101 to sandwich the respective cell transistors C and electrically connect the cell transistors C in series. The isolation insulators 121 and the inter layer dielectric 122 are silicon oxides, for example.

The first tunneling insulator 111 is formed on the substrate 101, more specifically, on an active region $R_2$. The first tunneling insulator 111 is an example of a first gate insulator of the present embodiment. The first tunneling insulator 111 is a silicon oxide, for example. The first tunneling insulator 111 is also denoted by TOX1.

The first tunneling insulator 111 serves as an F-N (Fowler-Nordheim) tunneling film in this embodiment. An F-N tunneling film is an insulating film having such a thickness that a charge transmission by virtue of F-N tunneling is dominant. The thickness of the first tunneling insulator 111 in this embodiment is equal to or greater than 3 nm (preferably 3 to 5 nm) in equivalent silicon oxide thickness, i.e., in EOT (Equivalent Oxide Thickness), for example. The F-N tunneling film will be described below in detail.

The first floating gate 112 is formed on the first tunneling insulator 111. The first floating gate 112 serves as a charge storage film for storing charges. The first floating gate 112 in this embodiment is a metal layer formed of conductive metal material. The first floating gate 112 is also denoted by FG1.

The second tunneling insulator 113 is formed on the first floating gate 112. The second tunneling insulator 113 is an example of a second gate insulator of the present embodiment. The second tunneling insulator 113 is a silicon oxide, for example. The second tunneling insulator 113 is also denoted by TOX2.

The second tunneling insulator 113 in this embodiment serves as an F-N tunneling film, similarly to the first tunneling insulator 111. The thickness of the second tunneling insulator 113 is equal to or greater than 3 nm (preferably 3 to 5 nm) in EOT, for example. The thickness of the first tunneling insulator 111 and the thickness of the second tunneling insulator 113 are preferably equal to each other in effective thickness, i.e., in EOT, but may not be equal to each other in physical thickness.

The second floating gate 114 is formed on the second tunneling insulator 113. The second floating gate 114 serves as a charge storage film for storing charges, similarly to the first floating gate 112. The second floating gate 114 of this embodiment is a polysilicon layer formed of polysilicon. The second floating gate 114 may be an n-polysilicon layer or a p-polysilicon layer. The second floating gate 114 in this embodiment is an n⁺-polysilicon layer. The second floating gate 114 is also denoted by FG2.

The IPD film 115 is formed on the second floating gate 114. The IPD film 115 is an example of an intergate insulator of the present embodiment. The IPD film 115 is a silicon oxynitride, for example. The IPD film 115 serves as a charge blocking film which prevents (blocks) charges injected from the first floating gate 112 into the second floating gate 114 from escaping into the control gate 116. The thickness of the IPD film 115 of this embodiment is greater than the thickness of the first tunneling insulator 111 and the thickness of the second tunneling insulator 113 in effective thickness, i.e., in EOT.

The control gate 116 is formed on the IPD film 115. The control gate 116 serves as a control electrode for controlling the potentials of the cell transistors C. The control gate 116 is a polysilicon layer formed of polysilicon, for example. The control gate 116 may be an n-polysilicon layer or a p-polysilicon layer. The control gate 116 in this embodiment is an n⁺-polysilicon layer. The control gate 116 is also denoted by CG.

As described above, the floating gate of each cell transistor C is formed with the first and second floating gates 112 and 114, and the second tunneling insulator 113 is formed between the first floating gate 112 and the second floating gate 114. With this arrangement, the coupling ratio between the second floating gate 114 and the control gate 116 is improved, and the electric field to be applied to the first tunneling insulator 111 increases. Accordingly, the write characteristics of the cell transistors C are improved. Further, the capacitance in the cells increases, and the coupling ratio becomes higher. Accordingly, interference between adjacent cells is restrained.

Each of the first tunneling insulator 111, the second tunneling insulator 113, and the IPD film 115 may be a single-layer film including only one insulating layer, or may be a stack film including two or more insulating layers. Examples of the single-layer film include a silicon oxide layer and a silicon oxynitride layer, and an example of the stack film includes a double-layer film including a silicon oxide layer and a high-k insulating layer (such as an $Si_3N_4$ layer).

Each of the cell transistors C includes the two floating gates 112 and 114 in this embodiment, but may include three or more floating gates. If each cell transistor C includes N floating gates (N is an integer of 2 or greater), each cell transistor C further includes N tunneling insulators, and the tunneling insulators and the floating gates are alternately stacked.

The materials of the first and second floating gates 112 and 114 are now described.

In this embodiment, the floating gate of each cell transistor C is formed with two charge storage films (112 and 114). On the other hand, in a conventional semiconductor memory device, each floating gate is formed with one charge storage film such as an $n^+$-polysilicon layer. However, if $n^+$-doping is insufficient in the floating gate of $n^+$-polysilicon, the lower portion of the floating gate formed is depleted. With such depletion, a tunneling current as a write current cannot flow easily, and the writing speed becomes lower.

In this embodiment, it is considered that the first and second floating gates 112 and 114 be formed with $n^+$-silicon layers. In such a case, however, the lower portion of the first floating gate 112 is depleted at the time of writing, and the upper portion of the first floating gate 112 is depleted at the time of erasing, if $n^+$-doping is insufficient in the first floating gate 112. With such depletion, a tunneling current as a write or erase current cannot flow easily, and the writing speed and the erasing speed become lower.

To counter this problem, the first floating gate 112 is a metal layer, and the second floating gate 114 is a polysilicon layer in this embodiment. With this arrangement, the lower portion of the floating gate 112 is not depleted at the time of writing, and the upper portion of the first floating gate 112 is not depleted at the time of erasing. Accordingly, the writing speed and the erasing speed are improved.

According to "Chen et al., Appl. Phys. Lett., vol. 49, p. 669 (1986)", high-energy electrons injected from a gate oxide cause collision ionization in a gate electrode, and holes generated due to the collision ionization reenter the gate oxide and generate defects. According to this theory, by changing the first floating gate 112 from a polysilicon layer to a metal layer, the frequency of the collision ionization can be lowered, and generations of defects in the first tunneling insulator 111 are reduced. As a result, a fluctuation of the threshold voltage at the time of writing or erasing can be restrained. Accordingly, the number of times that writing and erasing can be repeated can be increased in this embodiment.

As described above, in this embodiment, the first floating gate 112 is a metal layer, and the second floating gate 114 is a polysilicon layer. With this arrangement, the writing speed and the erasing speed can be made higher in this embodiment. Furthermore, the number of times that writing and erasing can be repeated can be increased in this embodiment.

Next, the cross sectional shapes of the IPD film 115 and the control gate 116 are described.

As shown in FIG. 2(A), the first tunneling insulator 111, the first floating gate 112, the second tunneling insulator 113, and the second floating gate 114 are divided into the cell transistors C. In FIG. 2(A), the first tunneling insulator 111, the first floating gate 112, the second tunneling insulator 113, and the second floating gate 114 are stacked on an active region $R_2$, and are formed between isolation insulators 121.

On the other hand, the IPD film 115 and the control gate 116 are shared by the cell transistors C adjacent to one another in the Y direction (direction parallel to the wordlines WL). In FIG. 2(A), the upper surface $S_1$ of each isolation insulator 121 is lower than the upper surface $S_2$ of the second floating gate 114. As a result, the lower surface $\sigma_1$ of the control gate 116 between the cell transistors C is lower than the lower surface $\sigma_2$ of the control gate 116 on the first and second floating gates 112 and 114, so that the control gate 116 fills the spaces between the cell transistors C.

As described above, in this embodiment, the IPD film 115 and the control gate 116 are shared by cell transistors C adjacent to one another in the direction parallel to the wordlines. Further, the lower surface of the control gate 116 between the cell transistors C is lower than the lower surface of the control gate 116 on the cell transistors C (i.e., on the first and second floating gates 112 and 114), so that the control gate 116 fills the spaces between the cell transistors C. With this arrangement, the capacitance between the second floating gate 114 and the control gate 116 can be increased, and the capacitive coupling can be made stronger. As a result, the write characteristics of the cell transistors C can be further improved in this embodiment.

In this embodiment, the height of the upper surface of each isolation insulator 121 is equal to the height of the upper surface of the second tunneling insulator 113. However, the height of the upper surface of each isolation insulator 121 may be between the height of the upper surface of the second floating gate 112 and the height of the upper surface of the second tunneling insulator 113.

In this embodiment, the thickness of the IPD film 115 between the cell transistors C may be equal to or different from the thickness of the IPD film 115 on the first and second floating gates 112 and 114. In this embodiment, the thickness of the IPD film 115 between the cell transistors C and the thickness of the IPD film 115 on the first and second floating gates 112 and 114 are greater than the thickness of the first tunneling insulator 111 and the thickness of the second tunneling insulators 113 in effective thickness.

Next, a direct tunneling film and an F-N tunneling film are described.

Figure 3:
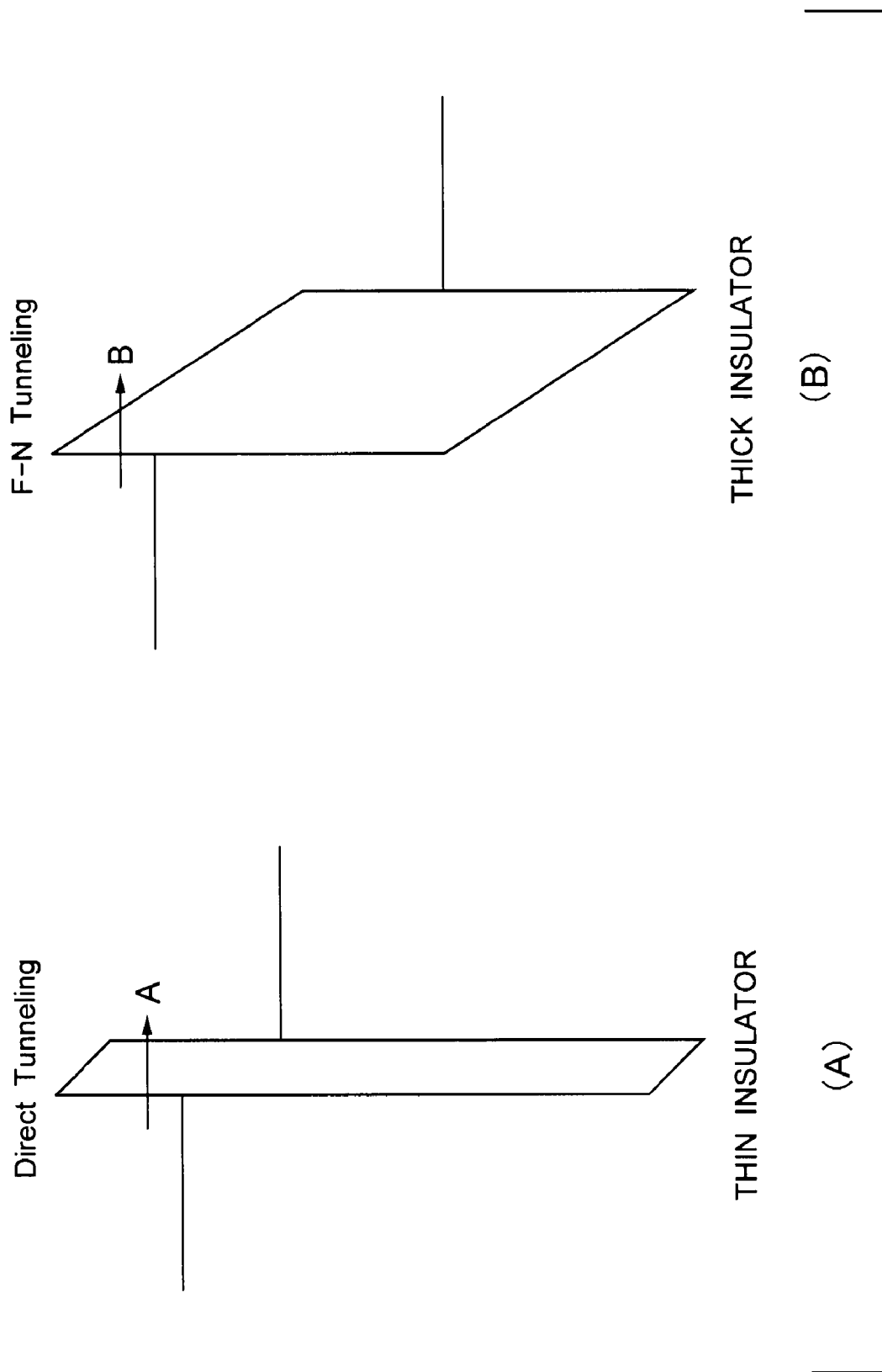
FIG. 3 illustrates conceptual diagrams for explaining a direct tunneling film and an F-N tunneling film.

FIG. 3 illustrates conceptual diagrams for explaining a direct tunneling film and an F-N tunneling film. The horizontal direction in FIG. 3 is the thickness direction of each insulating film, and the vertical direction in FIG. 3 is the height direction of the potential inside and outside of each insulating film.

FIG. 3(A) illustrates an insulating film having a small thickness. The insulating film illustrated in FIG. 3(A) is a direct tunneling film. A direct tunneling film is an insulating film having such a thickness that a charge transmission due to direct tunneling is dominant. Charges located near the direct tunneling film cause direct tunneling at a certain probability, and pass through the direct tunneling film, as indicated by an arrow A in FIG. 3(A).

FIG. 3(B) illustrates an insulating film having a large thickness. The insulating film illustrated in FIG. 3(B) is an F-N tunneling film. As described above, an F-N tunneling film is an insulating film having such a thickness that a charge transmission due to F-N tunneling is dominant. The probability that charges located near the F-N tunneling film pass through the F-N tunneling film due to direct tunneling is low. However, by applying an electric field to the F-N tunneling film, the potential barrier of the F-N tunneling film is tilted, and the barrier becomes thinner. As a result, the charges located near the F-N tunneling film cause F-N tunneling, and pass through the F-N tunneling film, as indicated by an arrow B in FIG. 3(B).

Figure 4:
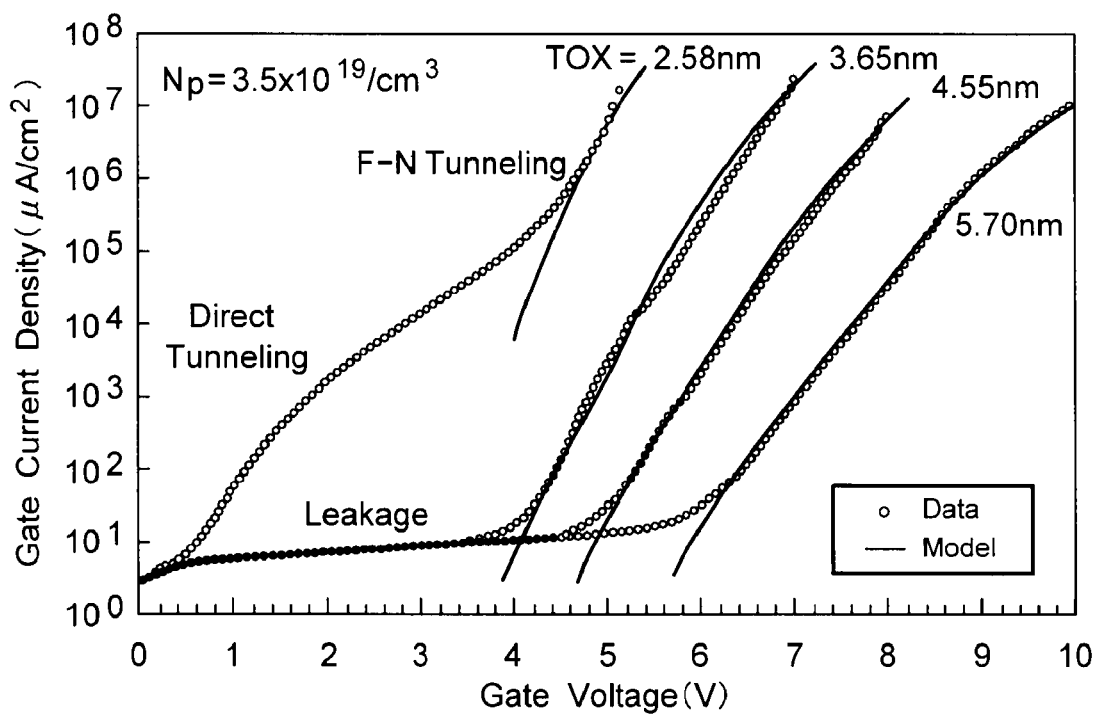
FIG. 4 is a graph showing measured values of direct tunneling currents and F-N tunneling currents.

FIG. 4 is a graph showing measured values of direct tunneling currents and F-N tunneling currents. The horizontal axis in FIG. 4 indicates a gate voltage [V] to be applied to an n-MOSFET of $n^+$-poly, and the vertical axis in FIG. 4 indicates a current density [$\mu A/cm^2$] of a gate current in the n-MOSFET.

FIG. 4 shows measured values of gate currents including direct tunneling currents and F-N tunneling currents, and theoretical values of F-N tunneling currents in cases where the thickness of a TOX film (tunneling insulator) of the n-MOSFET are from 2.58 nm, 3.65 nm, 4.55 nm, to 5.70 nm, and the TOX film is a silicon oxide film.

As can be seen from FIG. 4, where the thickness of the TOX film is 3.65 nm, 4.55 nm, or 5.70 nm, the gate current is substantially equal to the F-N tunneling current in almost all the gate voltage region higher than a gate voltage with which the gate current starts flowing. On the other hand, where the thickness of the TOX film is 2.58 nm, the gate current is equal to the F-N tunneling current only in a region higher than a predetermined voltage within the above-mentioned gate voltage region.

It is understood from the above that a charge transmission due to F-N tunneling is dominant in such an insulating film that has an effective thickness of 3 nm or greater. Therefore, an insulating film of 3 nm or greater in effective thickness can be regarded as an F-N tunneling film. Therefore, in this embodiment, the effective thicknesses of the first and second tunneling insulators 111 and 113 are set at 3 nm or greater. With this arrangement, the first and second tunneling insulators 111 and 113 serve as F-N tunneling films.

The graph shown in FIG. 4 is described in greater detail by A. Gupta et al., in "IEEE Trans. Electron Device Lett. 18 (1977) 580".

As described above, in this embodiment, the first and second tunneling insulators 111 and 113 are F-N tunneling films. With this arrangement, charges in the first floating gate 112 are prevented from flowing into the substrate 101, and charges in the second floating gate 114 are prevented from flowing into the first floating gate 112. As a result, with respect to the charges stored in the floating gates 112 and 114, the proportion of the charges stored in the second floating gate 114 is larger, and the proportion of the charges stored in the first floating gate 112 is smaller in this embodiment. Accordingly, charges can be retained in the cell transistors C over a long period of time in this embodiment. In other words, according to this embodiment, the charge retention characteristics of the cell transistors C can be improved.

Further, in this embodiment, the IPD film 115 serves as a charge blocking film. Accordingly, charges injected from the substrate 101 into the first and second floating gates 112 and 114 can be prevented from escaping to the control gate 116.

Further, in this embodiment, the thicknesses of the first and second tunneling insulators 111 and 113 are set at 3 nm or greater in EOT. With this arrangement, those insulating films can serve as F-N tunneling films. Further, the thicknesses of the first and second tunneling insulators 111 and 113 may be set in the range of 3 nm to 5 nm in EOT in this embodiment. With such thicknesses, those insulating films can serve as F-N tunneling films in which writing by F-N tunneling is readily performed.

Further, in this embodiment, the effective thickness of the IPD film 115 is greater than the effective thicknesses of the first and second tunneling insulators 111 and 113 serving as F-N tunneling films. With this arrangement, the IPD film 115 can serve as a charge blocking film.

The structure of the semiconductor memory device of this embodiment described above is suitable for a miniaturization of the memory cells (cell transistors). According to this embodiment, a degradation of a performance of the semiconductor memory device can be restrained, while the memory cells can be miniaturized. More specifically, a degradation in write characteristics, an adjacent cell interference, a charge escaping and the like can be restrained, while the memory cells can be miniaturized.

Referring now to FIG. 2, writing and reading operations to be performed on the cell transistors are described. In the writing and reading operations, a cell transistor (selected cell) on which writing or reading is to be performed is selected from the cell transistors arranged in the memory cell array region Rc, and predetermined voltages are applied to the selected cell and unselected cells.

In this embodiment, when data is to be written into the selected cell, charges are injected from the substrate 101 into the first and second floating gates 112 and 114 of the selected cell, and the charges are stored in these floating gates 112 and 114. In this embodiment, the charges are stored mainly in the second floating gate 114, as mentioned above. When the data is to be written into the selected cell, a program voltage (write voltage) Vpgm is applied to a wordline electrically connected to the selected cell.

Figure 5:
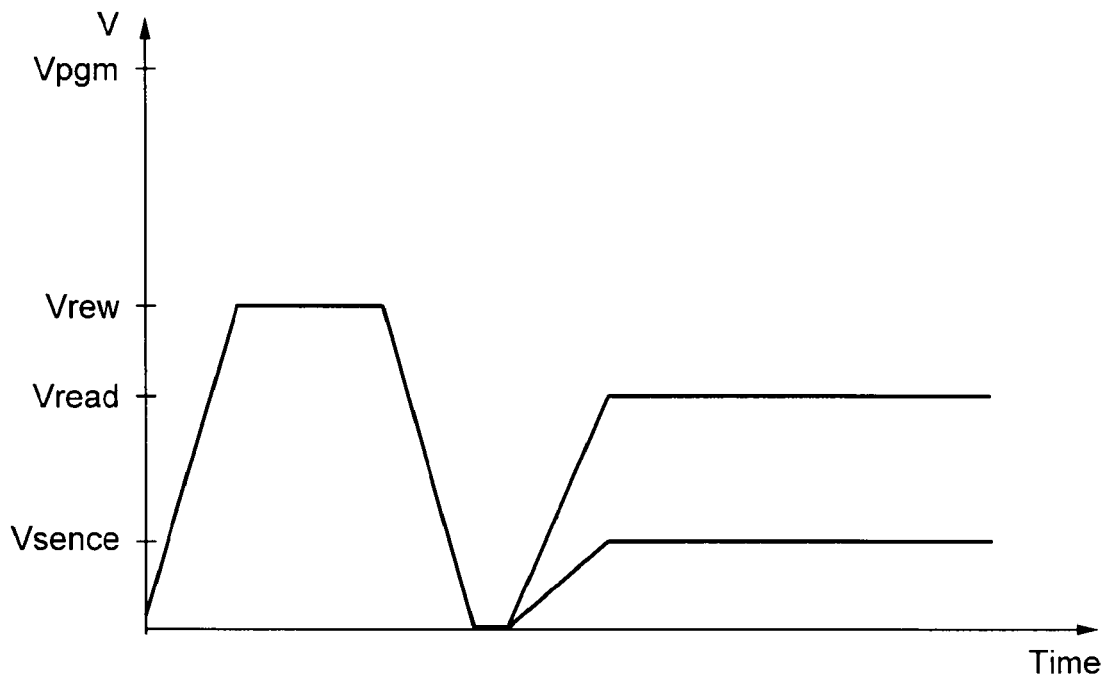
FIG. 5 is a timing chart showing a flow of a reading operation.

On the other hand, when the data is to be read from the selected cell, the reading is performed by a read control illustrated in FIG. 5. FIG. 5 is a timing chart showing a flow of the reading operation.

In this embodiment, charges are stored not only in the second floating gate 114 but also in the first floating gate 112. The charges stored in the second floating gate 114 might partially escape to the first floating gate 112 before the reading. The charges stored in the first floating gate 112 might change the threshold voltage of the cell transistors.

Therefore, a voltage Vrew larger than a read voltage Vread is applied to the wordline electrically connected to the selected cell, prior to the data reading from the selected cell in this embodiment (see FIG. 5). By doing so, the charges in the first floating gate 112 of the selected cell are returned to the second floating gate 114 of the selected cell.

Then, the read voltage Vread is applied to the wordline electrically connected to the selected cell, and a sense voltage Vsense smaller than the read voltage Vread is applied to a bitline electrically connected to the selected cell, so as to perform the reading (see FIG. 5). In this manner, a data reading from the selected cell can be performed with an accurate threshold voltage.

In this embodiment, the voltage Vrew (rewrite voltage) is set larger than the read voltage Vread, and smaller than the program voltage Vpgm.

The following is a description of a method of manufacturing the semiconductor memory device according to this embodiment.

Figure 6:
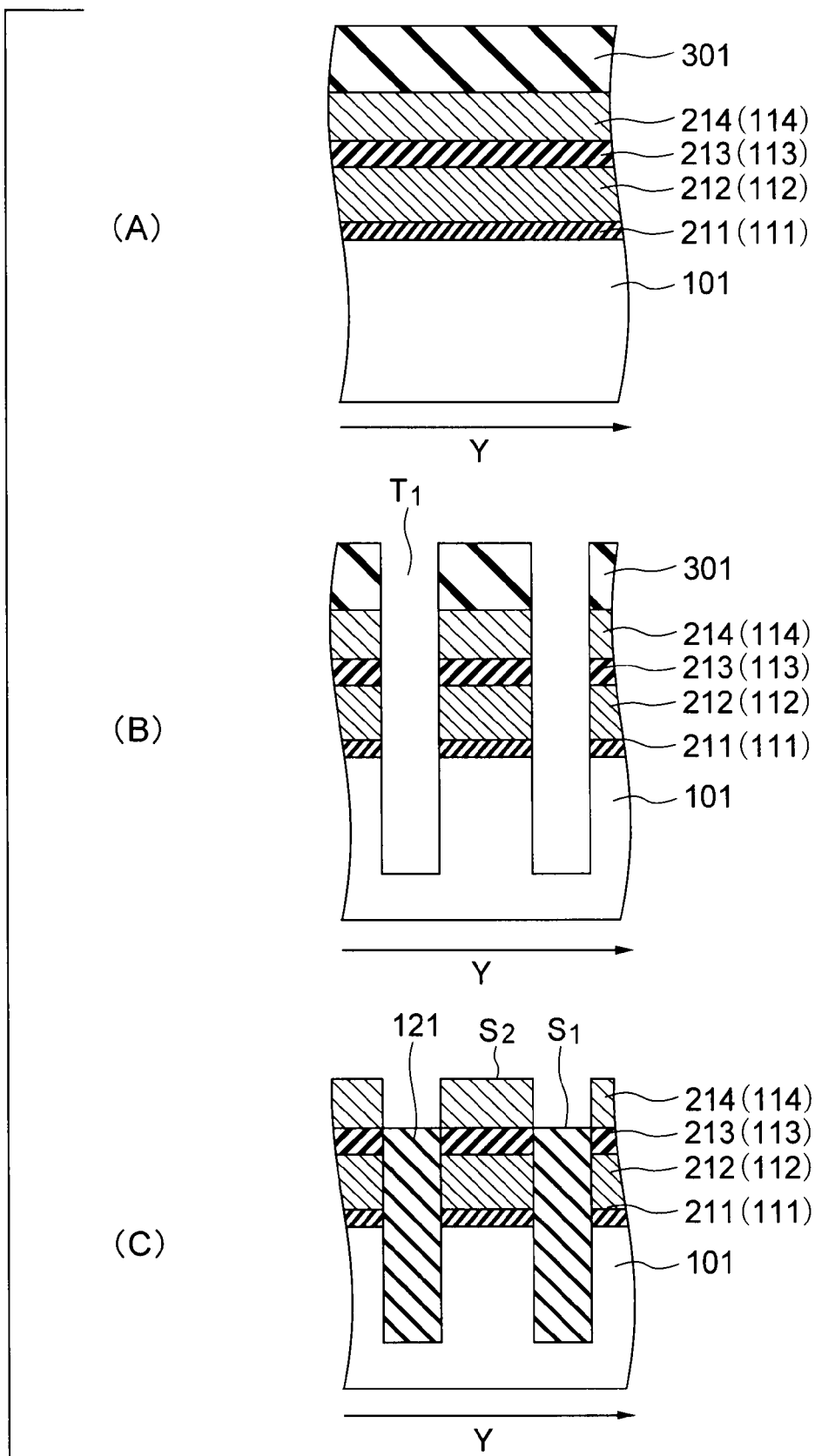
FIGS. 6 and 7 illustrate cross sectional views for explaining a method of manufacturing the semiconductor memory device according to the first embodiment.
Figure 7:
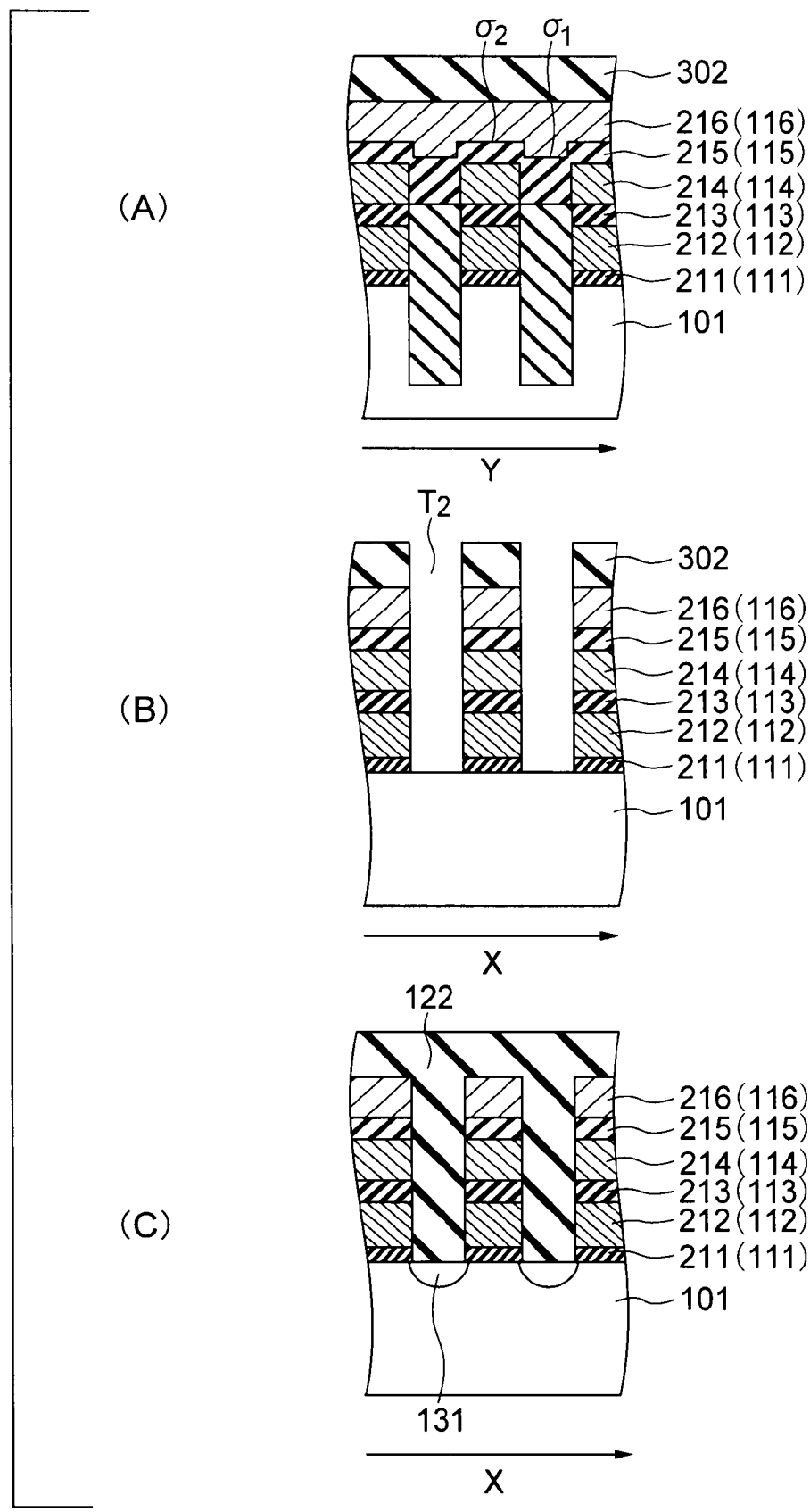

FIGS. 6 and 7 illustrate cross sectional views for explaining the method of manufacturing the semiconductor memory device according to the first embodiment.

First, as shown in FIG. 6(A), a first insulating film 211 as material of the first tunneling insulator 111, a first electrode layer 212 as material of the first floating gate 112, a second insulating film 213 as material of the second tunneling insulator 113, a second electrode layer 214 as material of the second floating gate 114, and a first mask layer 301 are stacked in this order on the substrate 101. The first insulating film 211, the second insulating film 213, and the first mask layer 301 are silicon oxide layers, for example. The first electrode layer 212 is a metal layer, and the second electrode layer 214 is a polysilicon layer in this embodiment.

Next, the first mask layer 301 is patterned by lithography and etching (FIG. 6(B)). Then, first trenches $T_1$ which isolation trenches are formed by etching using the first mask layer 301. The first trenches $T_1$ extend in the X direction (direction parallel to the bitlines BL), and penetrate through the second electrode layer 214, the second insulating film 213, the first electrode layer 212, and the first insulating film 211. The first trenches $T_1$ reach the inside of the substrate 101, and the bottom surfaces of the first trenches $T_1$ are lower than the upper surface of the substrate 101.

Next, as shown in FIG. 6(C), the isolation insulators 121 are buried in the first trenches $T_1$. The material of the isolation insulators 121 is silicon oxide, for example. The isolation insulators 121 are buried by depositing the material of the isolation insulators 121 on the entire surface of the substrate 101, and planarizing the surface of the material by CMP (Chemical Mechanical Polishing), for example. The CMP is performed until the height of the upper surface $S_1$ of each isolation insulator 121 becomes equal to the height of the upper surface $S_2$ of the second electrode layer 214.

In this embodiment, etching is then performed on the isolation insulators 121, so that the upper surface $S_1$ of each isolation insulator 121 becomes lower than the upper surface $S_2$ of the second electrode layer 214 (FIG. 6(C)). This etching is performed until the height of the upper surface of each isolation insulator 121 becomes equal to the height of the upper surface of the second insulating film 213 in this embodiment.

Next, as shown in FIG. 7(A), a third insulating film 215 as material of the IPD film 115, a third electrode layer 216 as material of the control gate 116, and a second mask layer 302 are formed in this order on the second electrode layer 214 and the isolation insulators 121. The third insulating film 215 is a silicon oxynitride layer, the third electrode layer 216 is a polysilicon layer, and the second mask layer 302 is a silicon oxide layer, for example. In FIG. 7(A), since the upper surface $S_1$ is lower than the upper surface $S_2$, the lower surface $\sigma_1$ of a part of the third electrode layer 216 between the cell transistors is lower than the lower surface $\sigma_2$ of a part of the third electrode layer 216 on the first and second electrode layers 212 and 214.

Next, the second mask layer 302 is patterned by lithography and etching (FIG. 7(B)). Then, second trenches $T_2$ are formed by etching using the second mask layer 302. The second trenches $T_2$ extend in the Y direction (direction parallel to the wordlines WL), and penetrate through the third electrode layer 216, the third insulating film 215, the second electrode layer 214, the second insulating film 213, the first electrode layer 212, and the first insulating film 211. In this embodiment, the heights of the bottom surfaces of the second trenches $T_2$ are equal to the height of the upper surface of the substrate 101.

In this way, the cell transistors, each of which includes the first tunneling insulator 111, the first floating gate 112, the second tunneling insulator 113, the second floating gate 114, the IPD film 115, and the control gate 116, are formed on the substrate 101. Then, the source/drain diffusion layers 131 are formed in the substrate 101, and the inter layer dielectric 122 is formed on the substrate 101 to cover the cell transistors (FIG. 7(C)). Furthermore, contact plugs, via plugs, various interconnect layers and the like are formed on the substrate 101.

As described above, in this embodiment, the floating gate of each cell transistor is formed with the first floating gate 112 and the second floating gate 114, and the second tunneling insulator 113 serving as an F-N tunneling film is formed between the first floating gate 112 and the second floating gate 114. Furthermore, the first floating gate 112 is a metal layer, and the second floating gate 114 is a polysilicon layer. With this arrangement, the charge retention characteristics of the cell transistors can be improved, while the writing speed and the erasing speed can be made higher. Further, the number of times that writing and erasing can be repeated can be increased.

In the following, second to eighth embodiments of the present invention are described. Since those embodiments are modifications of the first embodiment, differences from the first embodiment are mainly described with respect to those embodiments.

Second Embodiment

Similarly to the first embodiment, a second embodiment is described with reference to FIG. 2.

In the first embodiment, the first floating gate 112 is a metal layer, and the second floating gate 114 is a polysilicon layer. On the other hand, in the second embodiment, the first floating gate 112 is a polysilicon layer, and the second floating gate 114 is a metal layer. The first floating gate 112 may be an n-polysilicon layer or a p-polysilicon layer. In this embodiment, the first floating gate 112 is an $n^+$-polysilicon layer.

As described above, in this embodiment, the floating gate of each cell transistor C is formed with the first and second floating gates 112 and 114, and the second tunneling insulator 113 is formed between the first floating gate 112 and the second floating gate 114, similarly to the first embodiment. With this arrangement, the coupling ratio between the second floating gate 114 and the control gate 116 becomes higher, and the electric field to be applied to the first tunneling insulator 111 increases. Accordingly, the write characteristics of the cell transistors C are improved. Furthermore, the capacitance in the cells becomes larger, and the coupling ratio becomes higher. Accordingly, interference between adjacent cells is restrained.

Further, in this embodiment, the first floating gate 112 is a polysilicon layer, and the second floating gate 114 is a metal layer. In this case, a polysilicon deposition step to form the first floating gate 112 is carried out before a metal deposition step to form the second floating gate 114. Therefore, those floating gates 112 and 114 have advantages that a manufacture steps for them are similar to those in a mass-production process, so that the manufacture of them is easy. This is because that, in many mass-production processes, a polysilicon deposition step to form a gate electrode is carried out before a metal deposition step to form plugs and interconnects.

Further, the second floating gate 114 of a metal layer has an advantage that the lower portion of the second floating gate 114 is not depleted at the time of writing. Accordingly, the writing speed becomes higher in this embodiment.

Further, since the second floating gate 114 is changed from a polysilicon layer to a metal layer in this embodiment, the frequency of the collision ionization in the second floating gate 114 at the time of writing is lowered, so that the fluctuation of the threshold voltage in the writing is suppressed. Therefore, the number of times that writing and erasing can be repeated can be increased in this embodiment, similarly to the first embodiment.

As described above, in this embodiment, the floating gate of each cell transistor is formed with the first floating gate 112 and the second floating gate 114, and the second tunneling insulator 113 serving as an F-N tunneling film is formed between the first floating gate 112 and the second floating gate 114. Furthermore, the first floating gate 112 is a polysilicon layer, and the second floating gate 114 is a metal layer. With this arrangement, the charge retention characteristics of the cell transistors can be improved, while the writing speed can be made higher. Further, the number of times that writing and erasing can be repeated can be increased.

Third Embodiment

Similarly to the first and second embodiments, a third embodiment is described with reference to FIG. 2.

In the first and second embodiments, one of the first and second floating gates 112 and 114 is a metal layer. On the other hand, in the third embodiment, the first and second floating gates 112 and 114 are both metal layers. The metal material forming the first floating gate 112 may be the same as or different from the metal material forming the second floating gate 114.

As described above, in this embodiment, the floating gate of each cell transistor C is formed with the first and second floating gates 112 and 114, and the second tunneling insulator 113 is formed between the first floating gate 112 and the second floating gate 114, similarly to the first and second embodiments. With this arrangement, the coupling ratio between the second floating gate 114 and the control gate 116 becomes higher, and the electric field to be applied to the first tunneling insulator 111 increases. Accordingly, the write characteristics of the cell transistors C are improved. Furthermore, the capacitance in the cells becomes larger, and the coupling ratio becomes higher. Accordingly, interference between adjacent cells is restrained.

Further, in this embodiment, the first and second floating gates 112 and 114 are both metal layers. The first floating gate 112 of a metal layer has an advantage that the lower portion of the first floating gate 112 is not depleted at the time of writing, and the upper portion of the first floating gate 112 is not depleted at the time of erasing. Accordingly, the writing speed and the erasing speed are made higher. The second floating gate 114 of a metal layer has an advantage that the lower portion of the second floating gate 114 is not depleted at the time of writing. Accordingly, the writing speed is made even higher in this embodiment.

Further, since the first and second floating gates 112 and 114 are changed from polysilicon layers to metal layers in this embodiment, the frequency of the collision ionization in the first and second floating gates 112 and 114 at the time of writing or erasing is lowered, and the fluctuation of the threshold voltage in the writing or erasing is suppressed. Therefore, the number of times that writing and erasing can be repeated can be increased in this embodiment, similarly to the first and second embodiments.

As described above, in this embodiment, the floating gate of each cell transistor is formed with the first floating gate 112 and the second floating gate 114, and the second tunneling insulator 113 serving as an F-N tunneling film is formed between the first floating gate 112 and the second floating gate 114. Furthermore, the first and second floating gates 112 and 114 are both metal layers. With this arrangement, the charge retention characteristics of the cell transistors can be further improved, while the writing speed and the erasing speed can be made even higher than in the first and second embodiments. Further, the number of times that writing and erasing can be repeated can be increased.

Fourth Embodiment

Figure 8:
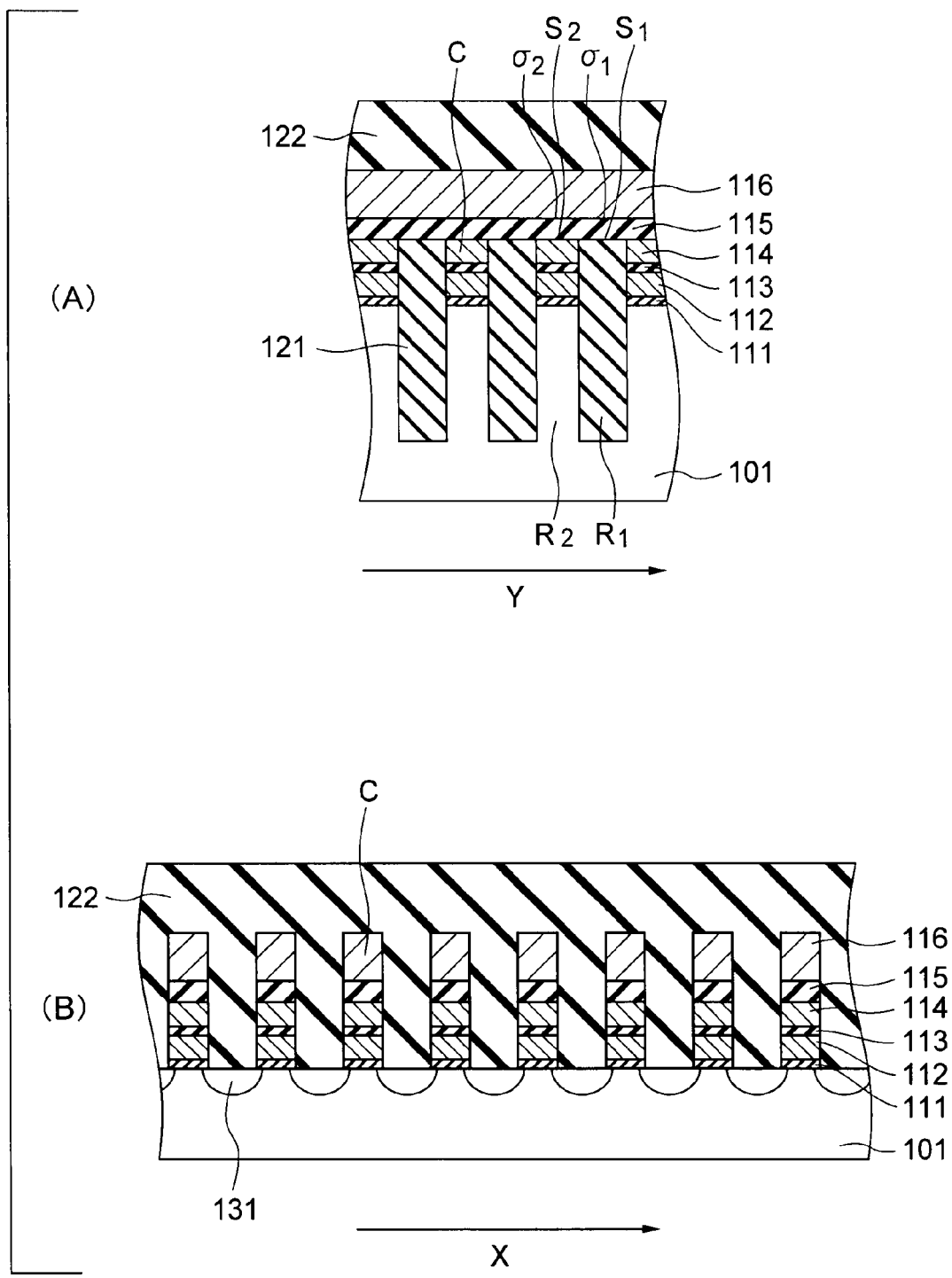
FIG. 8 illustrates cross sectional views showing a configuration of a semiconductor memory device according to a fourth embodiment.

FIG. 8 illustrates cross sectional views showing a configuration of a semiconductor memory device according to a fourth embodiment.

In FIG. 8(A), the IPD film 115 and the control gate 116 are shared by the cell transistors C adjacent to one another in the Y direction (direction parallel to the wordlines WL), similarly to those in FIG. 2(A). However, in FIG. 8(A), the height of the upper surface $S_1$ of each isolation insulator 121 is equal to the height of the upper surface $S_2$ of the second floating gate 114, differently from that in FIG. 2(A). As a result, in FIG. 8(A), the lower surface of the IPD film 115 and the lower surface of the control gate 116 are flat, and the height of the lower surface $\sigma_1$ of the control gate 116 between the cell transistors C is equal to the height of the lower surface $\sigma_2$ of the control gate 116 on the first and second floating gates 112 and 114.

With this arrangement, the capacitance between adjacent cells can be made smaller, and variations of concave portions of the control gate 116 can be avoided in this embodiment. When the spaces between the cell transistors are filled with portions of the control gate 116, some portions of the control gate 116 are buried in the spaces, but other some portions of the control gate 116 are not buried in the spaces, due to variations of the processes to form the cell transistors C. This is problematic particularly when the cell transistors C are miniaturized. If the cell transistors C miniaturized, it becomes more difficult to fill the spaces with the control gate 116. Also, if the cell transistors C are miniaturized, the coupling between adjacent cells becomes stronger, and each memory cell is greatly affected by the potential change in the adjacent cells.

However, in this embodiment, since the control gate 116 is not buried in the spaces with its concave portions, the problem accompanying the formation of the concave portions of the control gate 116 can be avoided. Further, since the capacitance between adjacent cells can be made smaller, the problem that each memory cell is greatly affected by the potential change in the adjacent cells can also be avoided.

The following is a description of a method of manufacturing the semiconductor memory device according to this embodiment.

Figure 9:
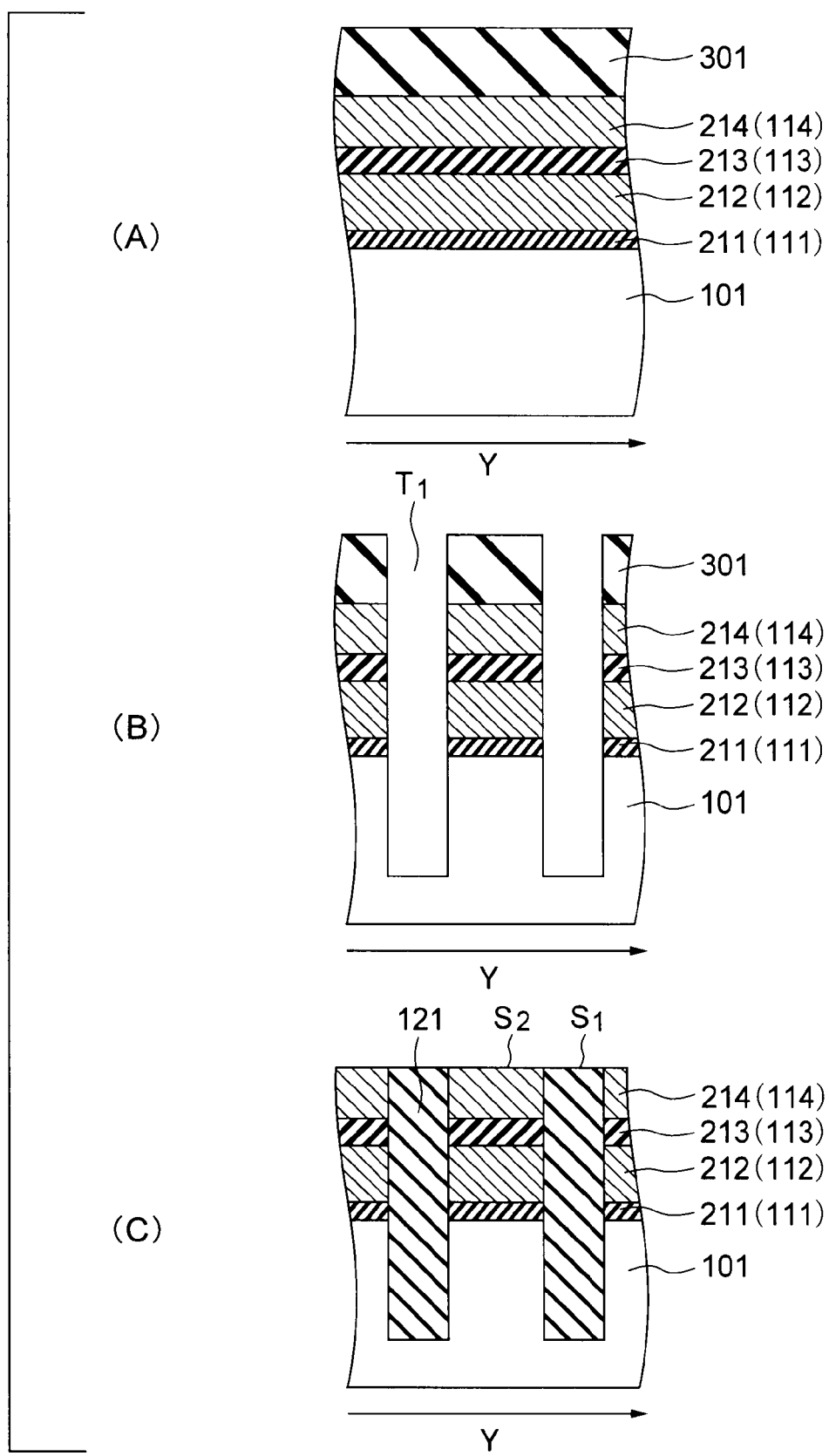
FIGS. 9 and 10 illustrate cross sectional views for explaining a method of manufacturing the semiconductor memory device according to the fourth embodiment.
Figure 10:
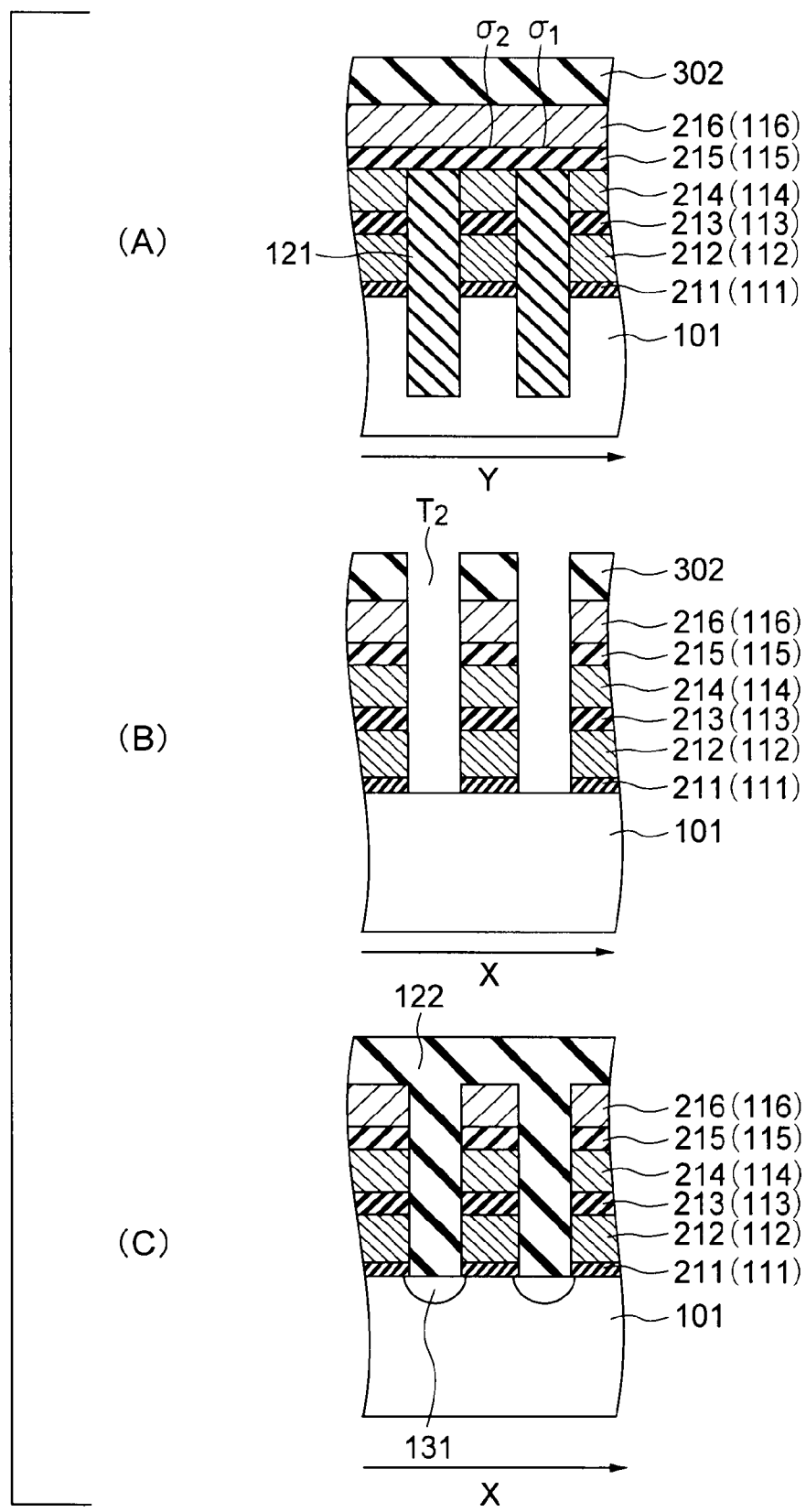

FIGS. 9 and 10 illustrate cross sectional views for explaining the method of manufacturing the semiconductor memory device according to the fourth embodiment.

First, as shown in FIG. 9(A), a first insulating film 211 as material of the first tunneling insulator 111, a first electrode layer 212 as material of the first floating gate 112, a second insulating film 213 as material of the second tunneling insulator 113, a second electrode layer 214 as material of the second floating gate 114, and a first mask layer 301 are stacked in this order on the substrate 101.

Next, the first mask layer 301 is patterned by lithography and etching (FIG. 9(B)). Then, first trenches $T_1$ which are isolation trenches are formed by etching using the first mask layer 301.

Next, as shown in FIG. 9(C), the isolation insulators 121 are buried in the first trenches $T_1$. The isolation insulators 121 are buried by depositing the material of the isolation insulators 121 on the entire surface of the substrate 101, and planarizing the surface of the material by CMP. The CMP is performed until the height of the upper surface $S_1$ of each isolation insulator 121 becomes equal to the height of the upper surface $S_2$ of the second electrode layer 214.

Next, as shown in FIG. 10(A), a third insulating film 215 as material of the IPD film 115, a third electrode layer 216 as material of the control gate 116, and a second mask layer 302 are formed in this order on the second electrode layer 214 and the isolation insulators 121. In FIG. 10(A), since the height of the upper surface $S_1$ is smaller than the height of the upper surface $S_2$, the height of the lower surface $\sigma_1$ of the third electrode layer 216 between the cell transistors is equal to the height of the lower surface $\sigma_2$ of the third electrode layer 216 on the first and second electrode layers 212 and 214.

Next, the second mask layer 302 is patterned by lithography and etching (FIG. 10(B)). Then, second trenches $T_2$ are formed by etching using the second mask layer 302.

In this way, the cell transistors, each of which includes the first tunneling insulator 111, the first floating gate 112, the second tunneling insulator 113, the second floating gate 114, the IPD film 115, and the control gate 116, are formed on the substrate 101. Then, the source/drain diffusion layers 131 are formed in the substrate 101, and the inter layer dielectric 122 is formed on the substrate 101 to cover the cell transistors (FIG. 10(C)). Furthermore, contact plugs, via plugs, various interconnect layers and the like are formed on the substrate 101.

In this embodiment, only one of the first and second floating gates 112 and 114 may be a metal layer, or both of the first and second floating gates 112 and 114 may be metal layers. In the former case, the same advantages as those of the first or second embodiment can be achieved. In the latter case, the same advantages as those of the third embodiment can be achieved.

As described above, in this embodiment, the floating gate of each cell transistor is formed with the first floating gate 112 and the second floating gate 114, and the second tunneling insulator 113 serving as an F-N tunneling film is formed between the first floating gate 112 and the second floating gate 114. Furthermore, at least one of the first and second floating gates 112 and 114 is a metal layer. With this arrangement, this embodiment can achieve the same advantages as those of one of the first to third embodiments in the writing speed, the erasing speed, and the charge retention characteristics.

Also, in this embodiment, the height of the lower surface $\sigma_1$ of the control gate 116 between the cell transistors C is substantially equal to the height of the lower surface $\sigma_2$ of the control gate 116 on the first and second floating gates 112 and 114. With this arrangement, the capacitance between adjacent cells can be made smaller, and variations of the concave portions of the control gate 116 are avoided.

Fifth Embodiment

Referring to FIG. 2, a fifth embodiment is described.

In this embodiment, the first floating gate 112 is a metal layer, and the second floating gate 114 is a polysilicon layer, similarly to the first embodiment. The second floating gate 114 may be an n-polysilicon layer or a p-polysilicon layer. In this embodiment, the second floating gate 114 is an $n^+$-polysilicon layer.

In this embodiment, the first floating gate 112 is formed of metal material having a higher work function than the work function of polysilicon ($n^+$-polysilicon) forming the second floating gate 114. The work function of $n^+$-polysilicon is approximately 4.1 eV, though it varies with the impurity density in the polysilicon. Therefore, the first floating gate 112 is formed of metal material having a higher work function than 4.1 eV in this embodiment. Examples of the metal material having a higher work function than the work function of $n^+$-polysilicon include Co (5.0 eV), Ni (5.1 eV), CoSi (4.5 eV), and NiSi (4.7 eV). Co and Ni are advantageous in having lower resistance than CoSi and NiSi.

Figure 11:
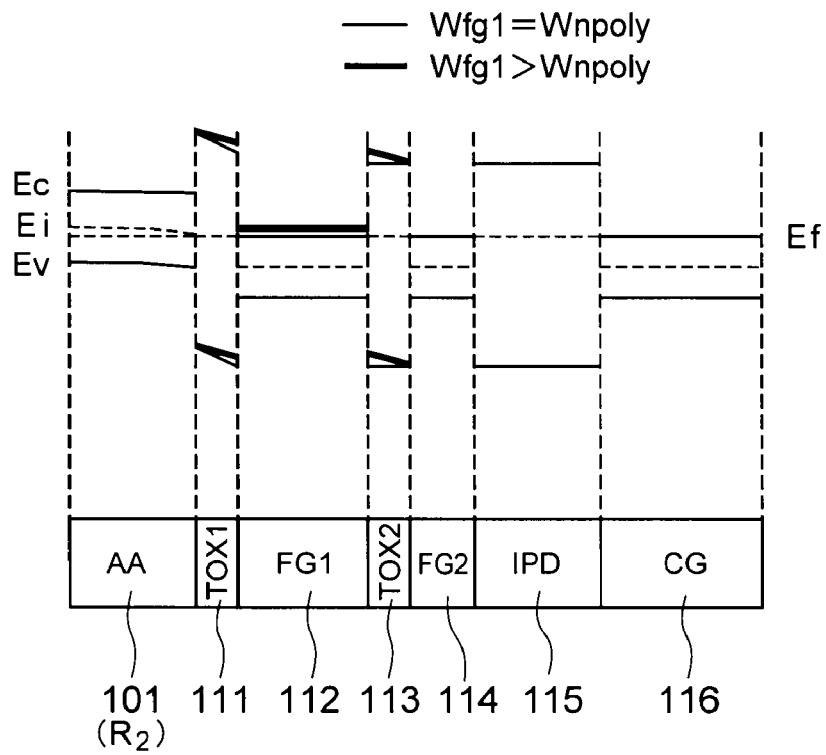
FIG. 11 is a band diagram for explaining a state of a cell transistor observed prior to writing.
Figure 12:
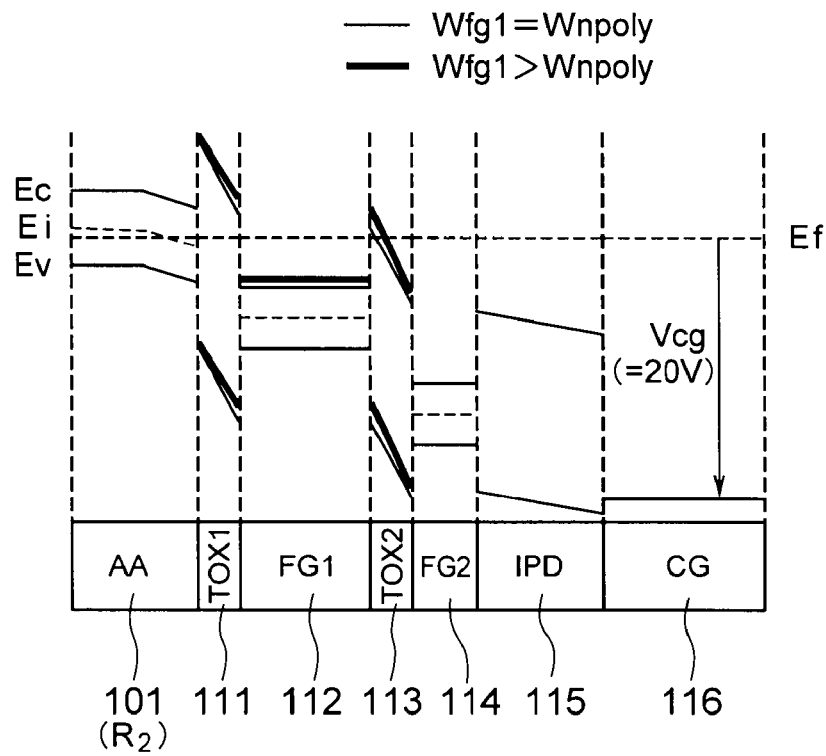
FIG. 12 is a band diagram for explaining a state of the cell transistor in the time of writing.
Figure 13:
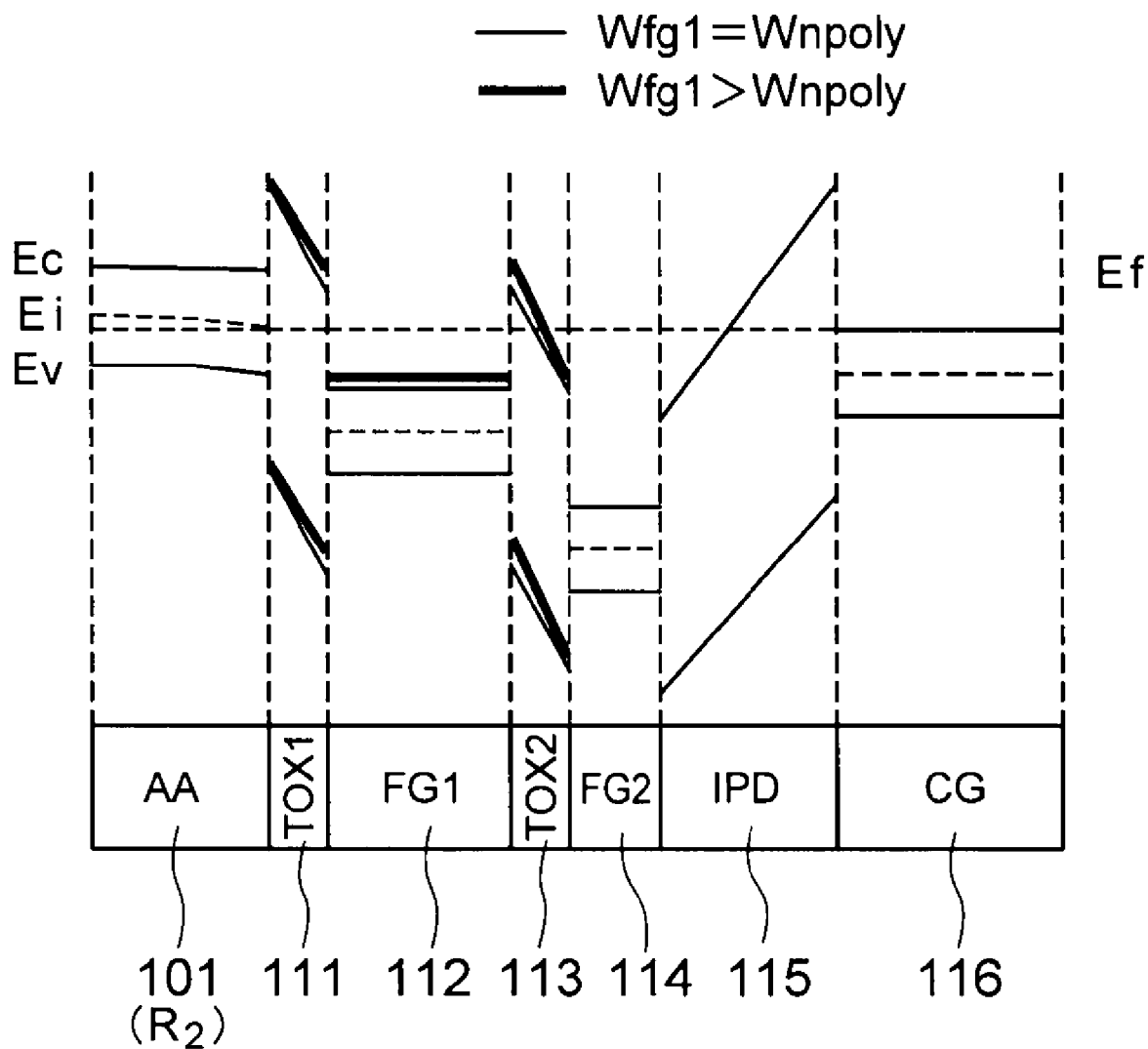
FIG. 13 is a band diagram for explaining a state of the cell transistor after writing.

The following is a description of advantages of the semiconductor memory device according to this embodiment, with reference to band diagrams shown in FIGS. 11 to 13.

FIG. 11 is a band diagram for explaining a state of a cell transistor observed prior to writing.

In FIG. 11, solid lines indicate the energy Ec of the lower edge of the conduction band and the energy Ev of the upper edge of the valence band. FIG. 11 further shows the intrinsic Fermi energy Ei and the Fermi energy Ef.

FIG. 11 is a band diagram showing a situation where the potential Vsub and Vcg of the substrate 101 and the control gate 116 are set at 0 V, and the first and second floating gates 112 and 114 are in a charge neutral state. Thin lines in FIG. 11 indicate the energy band observed where the work function Wfg1 of the first floating gate 112 is equal to the work function Wnpoly of $n^+$-polysilicon. On the other hand, bold lines in FIG. 11 indicate the energy band observed where the work function Wfg1 of the first floating gate 112 is higher than the work function Wnpoly of $n^+$-polysilicon. In FIG. 11, it is supposed that the work function Wfg2 of the second floating gate 114 is equal to the work function Wnpoly of $n^+$-polysilicon.

As can be seen from FIG. 11, the tilt of the potential in each of the first and second tunneling insulators 111 and 113 in a case where Wfg1 is higher than Wnpoly (Wfg1>Wnpoly) is different from the tilt of the potential in each of the first and second tunneling insulators 111 and 113 in a case where Wfg1 is equal to Wnpoly (Wfg1=Wnpoly), due to the difference of the work function Wfg1 of the first floating gate 112 between these cases. Due to the difference of the tilts, the electric field in the first and second tunneling insulators 111 and 113 in the case where Wfg1 is higher than Wnpoly (Wfg1>Wnpoly) is different from the electric field in the first and second tunneling insulators 111 and 113 in the case where Wfg1 is equal to Wnpoly (Wfg1=Wnpoly), as will be described below.

It is noted that, in the case where Wfg1 is higher than Wnpoly, the tilt of the potential in the first tunneling insulator 111 is gentler than that in the case where Wfg1 is equal to Wnpoly, but the tilt of the potential in the second tunneling insulator 113 is steeper than that in the case where Wfg1 is equal to Wnpoly.

FIG. 12 is a band diagram for explaining a state of the cell transistor at the time of writing.

As shown in FIG. 12, a voltage of approximately 20 V is applied to the control gate 116 at the time of writing (Vcg=20 V). As a result, the electric field in each of the first and second tunneling insulators 111 and 113 becomes larger, so that a tunneling current flows in those insulating films.

At this time, the electric field in the first tunneling insulator 111 in the case where Wfg1 is higher than Wnpoly (Wfg1>Wnpoly) is smaller than that in the case where Wfg1 is equal to Wnpoly (Wfg1=Wnpoly), and the electric field in the second tunneling insulator 113 in the case where Wfg1 is higher than Wnpoly (Wfg1>Wnpoly) is larger than that in the case where Wfg1 is equal to Wnpoly (Wfg1=Wnpoly). This is because, the tilt of the potential in the case where Wfg1 is higher than Wnpoly is different from that in the case where Wfg1 is equal to Wnpoly, as shown in FIG. 11.

Therefore, in the case where Wfg1 is higher than Wnpoly, a tunneling current does not easily flow in the first tunneling insulator 111, and a tunneling current easily flows in the second tunneling insulator 113, compared with the case where Wfg1 is equal to Wnpoly. Accordingly, more charges are stored in the second floating gate 114 than in the first floating gate 112. As a result, the tunneling current is restrained from flowing into the substrate 101, so that the charge retention characteristics of the cell transistor are improved.

If the first floating gate 112 is a $p^+$-polysilicon layer in the case where Wfg1 is higher than Wnpoly, electrons that are minor carriers in the $p^+$-polysilicon layer need to tunnel to the second tunneling insulator 113. As a result, a sufficient tunneling current might not flow. In this embodiment, however, a sufficient tunneling current is obtained, since the first flowing gate 112 is a metal layer.

FIG. 13 is a band diagram for explaining a state of the cell transistor after writing (at the time of charge retention).

As shown in FIG. 13, at the time of charge retention, the voltage Vcg of the control gate 116 is set at 0 V. Similarly to the time of writing, in the case where Wfg1 is higher than Wnpoly (Wfg1>Wnpoly), the electric field in the first tunneling insulator 111 is smaller than that in the case where Wfg1 is equal to Wnpoly (Wfg1=Wpoly), and the electric field in the second tunneling insulator 113 is larger than that in the case where Wfg1 is equal to Wnpoly (Wfg1=Wpoly). Since the electric field in the first tunneling insulator 111 is made smaller, the tunneling current is restrained from flowing into the substrate 101, so that the charge retention characteristics of the cell transistor are improved.

In this embodiment, the voltage Vcg of the control gate 116 is set at a negative value at the time of erasing. Since the first floating gate 112 is a metal layer in this embodiment, a large number of carriers (electrons) exist in the first floating gate 112. Accordingly, the erasing can be performed in a relatively short period of time in this embodiment.

As described above, in this embodiment, the second floating gate 114 is formed of polysilicon, and the first floating gate 112 is formed of metal material having a higher work function than the polysilicon. Accordingly, the charge retention characteristics of the cell transistors in this embodiment can be more improved than the charge retention characteristics achieved by the first embodiment, while the writing speed and the erasing speed can be made higher. Furthermore, the number of times that writing and erasing can be repeated can be increased.

Sixth Embodiment

Referring to FIG. 2, the sixth embodiment is described.

In this embodiment, the first floating gate 112 is a polysilicon layer, and the second floating gate 114 is a metal layer, similarly to the second embodiment. The first floating gate 112 may be an n-polysilicon layer or a p-polysilicon layer. In this embodiment, the first floating gate 112 is an $n^+$-polysilicon layer.

In this embodiment, the second floating gate 114 is formed of metal material having a higher work function than the work function of polysilicon ($n^+$-polysilicon) forming the first floating gate 112, similarly to the fifth embodiment. The work function of $n^+$-polysilicon is approximately 4.1 eV, though it varies with the impurity density in the polysilicon. Therefore, the second floating gate 114 is formed of metal material having a higher work function than 4.1 eV in this embodiment.

The fifth and sixth embodiments are now compared with each other.

As described above, in the fifth embodiment, in the case where the work function Wfg1 is higher than the work function Wnpoly (Wfg1>Wnpoly), the electric field in the first tunneling insulator 111 at the time of charge retention is smaller than that in the case where the work function Wfg1 is equal to the work function Wnpoly (Wfg1=Wnpoly). With this arrangement, the tunneling current flowing from the first floating gate 112 into the substrate 101 is restrained, so that the charge retention characteristics of the cell transistors are made higher than the charge retention characteristics achieved in the first embodiment.

Likewise, in the sixth embodiment, in the case where the work function Wfg2 is higher than the work function Wnpoly (Wfg2>Wnpoly), the electric field in the second tunneling insulator 113 is smaller than that in the case where Wfg2 is equal to Wnpoly (Wfg2=Wnpoly). With this arrangement, the tunneling current flowing from the second floating gate 114 into the first floating gate 112 is restrained, so that the charge retention characteristics of the cell transistors are made higher than the charge retention characteristics achieved in the second embodiment.

As described above, in this embodiment, the first floating gate 112 is formed of polysilicon, and the second floating gate 114 is formed of metal material having a higher work function than the polysilicon. Accordingly, the charge retention characteristics of the cell transistors in this embodiment can be made higher than the charge retention characteristics achieved in the second embodiment, while the writing speed can be made higher. Furthermore, the number of times that writing and erasing can be repeated can be increased.

Also, according to this embodiment, the first and second floating gates 112 and 114 can be more easily manufactured, similarly to the second embodiment.

Seventh Embodiment

Referring to FIG. 2, the seventh embodiment is described.

In this embodiment, the work function of the material forming the lower surface of the second floating gate 114 is set higher than the work function of the material forming the upper surface of the first floating gate 112. This setting can be realized by employing the configuration according to the third embodiment to set the work function of the metal material forming the second floating gate 114 higher than the work function of the metal material forming the first floating gate 112, or by employing the configuration according to the sixth embodiment.

As described above, in this embodiment, the work function of the material forming the lower surface of the second floating gate 114 is set higher than the work function of the material forming the upper surface of the first floating gate 112. As a result, the electric field in the second tunneling insulator 113 at the time of charge retention becomes smaller, similarly to the sixth embodiment. Accordingly, the tunneling current flowing from the second floating gate 114 into the first floating gate 112 is restrained in this embodiment, so that the charge retention characteristics of the cell transistors are improved.

If the configuration according to the third embodiment is employed to set the work function of the metal material forming the second floating gate 114 higher than the work function of the metal material forming the first floating gate 112, the work function of the metal material forming the first floating gate 112 may be set higher than the work function of $n^+$-polysilicon. In this case, examples of the metal material for the first floating gate 112 include Co (5.0 eV), Ni (5.1 eV), CoSi (4.5 eV), and NiSi (4.7 eV), and examples of the metal material for the second floating gate 114 include Pt (5.6 eV) and the like.

As described above, in this embodiment, the work function of the metal material forming the first floating gate 112 may be set higher than the work function of $n^+$-polysilicon. As a result, the electric field in the first tunneling insulator 111 at the time of charge retention becomes smaller, similarly to the fifth embodiment. Accordingly, the tunneling current flowing from the first floating gate 112 into the substrate 101 is restrained in this embodiment, so that the charge retention characteristics of the cell transistors are further improved.

In the third embodiment, the first and second floating gates 112 and 114 are both metal layers, so that the writing speed and the erasing speed can be made higher than those in the first and second embodiments, and the charge retention characteristics of the cell transistors can be improved, as described above.

Similarly to this, if the configuration according to the third embodiment is employed in the sixth embodiment, the work function of the metal material forming the second floating gate 114 is set higher than the work function of the metal material forming the first floating gate 112. Accordingly, the charge retention characteristics of the cell transistors can be improved, while the writing speed and the erasing speed can be made higher than those in the fifth and sixth embodiments. Furthermore, the number of times that writing and erasing can be repeated can be increased.

As described above, in this embodiment, the work function of the material forming the lower surface of the second floating gate 114 is set higher than the work function of the material forming the upper surface of the first floating gate 112. This setting can also be realized by employing configurations illustrated in FIG. 14.

Figure 14:
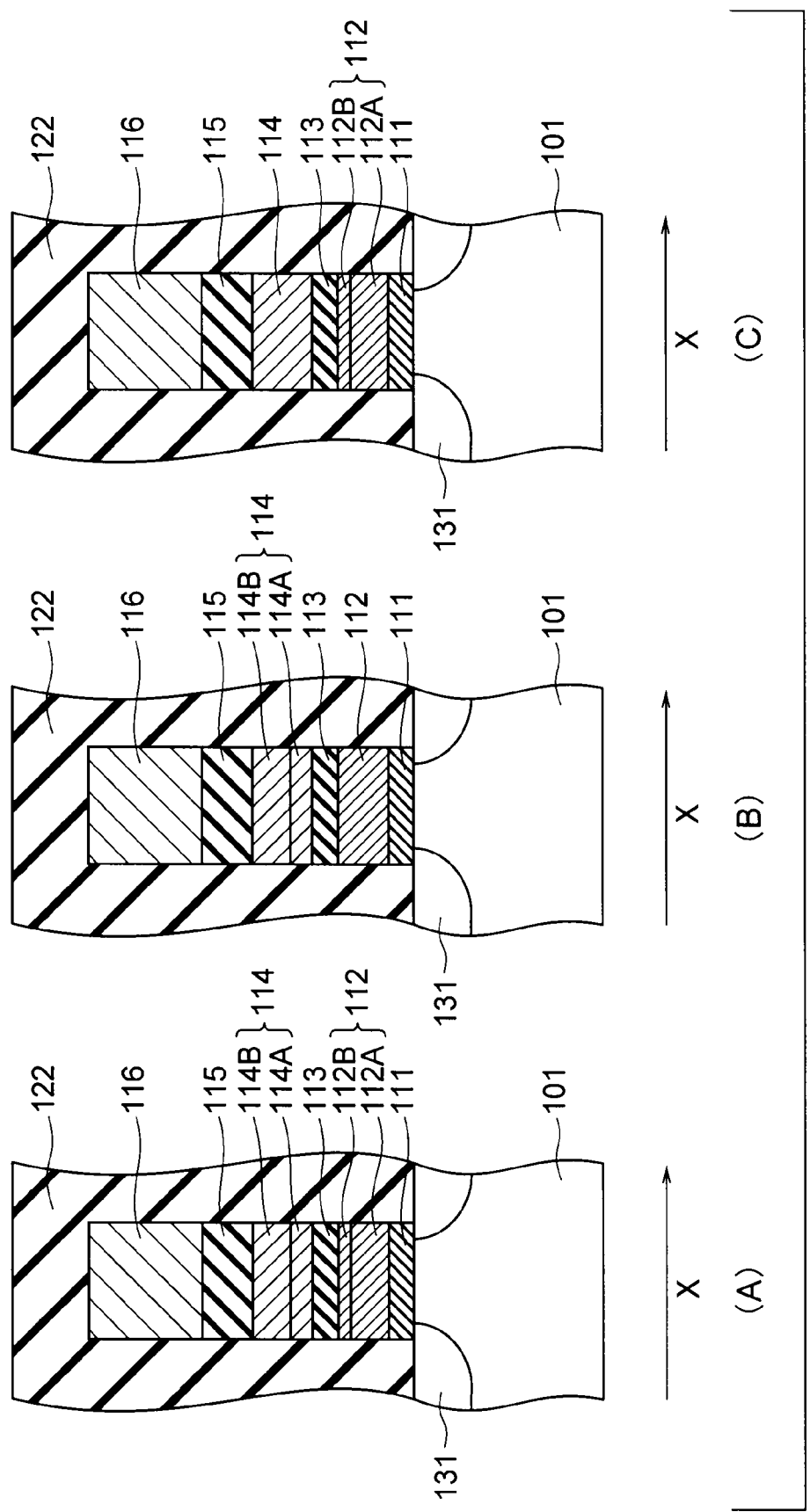
FIG. 14 illustrates cross sectional views showing configurations of semiconductor memory devices according to modifications of a seventh embodiment.

FIG. 14 illustrates cross sectional views showing configurations of semiconductor memory devices according to modifications of the seventh embodiment.

In a first modification illustrated in FIG. 14(A), each of the first and second floating gates 112 and 114 includes plural layers. More specifically, the first floating gate 112 includes two layers 112A and 112B, and the second floating gate 114 includes two layers 114A and 114B.

In this modification, the upper layer 112B of the first floating gate 112 and the lower layer 114A of the second floating gate 114 are formed with metal materials. Further, the work function of the metal material forming the lower layer 114A of the second floating gate 114 is set higher than the work function of the metal material forming the upper layer 112B of the first floating gate 112. With this arrangement, this modification can realize the configuration of the seventh embodiment in which the work function of the material forming the lower surface of the second floating gate 114 is higher than the work function of the material forming the upper surface of the first floating gate 112. Further, in this modification, the work function of the metal material forming the upper layer 112B of the first floating gate 112 may be set higher than the work function of $n^+$-polysilicon.

In this modification, the work function of the metal material of the lower layer 114A of the second floating gate 114 may be set higher than the work function of the metal material of the upper layer 112B of the first floating gate 112. With this structure, this modification can achieve the same advantages as those of the third embodiment.

In this modification, each of the first and second floating gates 112 and 114 may include three or more layers. In such a case, the uppermost layer of the first floating gate 112 and the lowermost layer of the second floating gate 114 are formed with metal materials.

In this modification, the lower layer 112A of the first floating gate 112 and the upper layer 114B of the second floating gate 114 may be metal layers or polysilicon layers such as $n^+$-polysilicon layers.

In a second modification illustrated in FIG. 14(B), the first floating gate 112 includes only one layer, and the second floating gate 114 includes plural layers (two layers 114A and 114B, to be more specific).

In this modification, the first floating gate 112 is formed of $n^+$-polysilicon, and the lower layer 114A of the second floating gate 114 is formed of metal material. Further, the work function of the metal material forming the lower layer 114A of the second floating gate 114 is set higher than the work function of the $n^+$-polysilicon. With this arrangement, this modification can realize the configuration of the seventh embodiment in which the work function of the material forming the lower surface of the second floating gate 114 is higher than the work function of the material forming the upper surface of the first floating gate 112. Furthermore, since the work function of the metal layer of the second floating gate 114 is higher than the work function of the $n^+$-polysilicon, this modification can achieve the same advantages as those of the sixth embodiment.

In this modification, the work function of the metal material of the lower layer 114A of the second floating gate 114 may not be set higher than the work function of the $n^+$-polysilicon. With this structure, this modification can achieve the same advantages as those of the second embodiment.

In this modification, the second floating gate 114 may include three or more layers. In such a case, the lowermost layer of the second floating gate 114 is formed of metal material.

In this modification, the upper layer 114B of the second floating gate 114 may be a metal layer or a polysilicon layer such as an $n^+$-polysilicon layer. Likewise, the first floating gate 112 may be a metal layer or a polysilicon layer other than an $n^+$-polysilicon layer.

In a third modification illustrated in FIG. 14(C), the first floating gate 112 includes plural layers (two layers 112A and 121B, to be more specific), and the second floating gate 114 includes only one layer.

In this modification, the upper layer 112B of the first floating gate 112 is formed of metal material, and the second floating gate 114 is formed of $n^+$-polysilicon. Further, the work function of the metal material forming the upper layer 112B of the first floating gate 112 is set higher than the work function of the $n^+$-polysilicon. Since the work function of the metal layer in the first floating gate 112 is higher than the work function of the $n^+$-polysilicon, this modification can achieve the same advantages as those of the fifth embodiment.

In this modification, the work function of the metal material of the upper layer 112 of the first floating gate 112 may not be set higher than the work function of the $n^+$-polysilicon. With this structure, this modification can achieve the same advantages as those of the first embodiment.

In this modification, the first floating gate 112 may include three or more layers. In such a case, the uppermost layer of the first floating gate 112 is formed of metal material.

In this modification, the lower layer 112A of the first floating gate 112 may be a metal layer or a polysilicon layer such as an $n^+$-polysilicon layer. Likewise, the second floating gate 114 may be a metal layer or a polysilicon layer other than an $n^+$-polysilicon layer.

As described above, according to the first to third modifications, the configuration according to the seventh embodiment can be realized, and the same advantages as those of the fifth or sixth embodiment can be achieved.

The first floating gate 112 formed with a metal layer and a polysilicon layer is advantageous in being more resistant to high-temperature processing than a first floating gate formed only with a metal layer. Likewise, the second floating gate 114 formed with a metal layer and a polysilicon layer is advantageous in being more resistant to high-temperature processing than a second floating gate formed only with a metal layer.

The uppermost layer of the first floating gate 112 and the lowermost layer of the second floating gate 114 may be formed with barrier metal materials.

The first floating gate 112 including plural layers may be formed by providing a first floating gate 112 including only a polysilicon layer and siliciding a part (upper part) of the polysilicon layer. The second floating gate 114 including plural layers may be formed by providing a second floating gate 114 including only a polysilicon layer and siliciding a part (upper part) of the polysilicon layer. Alternatively, each of the first floating gate 112 including plural layers and the second floating gate 114 including plural layers may be formed with a polysilicon layer and one or more other layers, with the entire polysilicon layer being silicided. In other words, each of the first and second floating gates 112 and 114 may be partially silicided. On the other hand, each of the first and second floating gates 112 and 114 may be fully silicided.

As described above, in this embodiment, the work function of the material forming the lower surface of the second floating gate 114 is set higher than the work function of the material forming the upper surface of the first floating gate 112. With this arrangement, the electric field to be applied to the second tunneling insulator 113 at the time of writing or charge retention becomes smaller, similarly to the sixth embodiment. Accordingly, the charge retention characteristics of the cell transistors can be improved, while the writing speed can be made higher. Furthermore, the number of times that writing and erasing can be repeated can be increased.

Also, in this embodiment, the upper surface of the first floating gate 112 and the lower surface of the second floating gate 114 may be formed with metal materials, so that the work function of the metal material forming the lower surface of the second floating gate 114 is set higher than the work function of the metal material forming the upper surface of the first floating gate 112. With this arrangement, the charge retention characteristics of the cell transistors can be improved, while the writing speed and the erasing speed can be made higher than those in the fifth and sixth embodiments.

Eighth Embodiment

Referring to FIG. 2, first to third examples of the eighth embodiment are described.

In the first example of this embodiment, the work function of the material forming the upper surface of the first floating gate 112 is set at a different value from the work function of the material forming the lower surface of the first floating gate 112. This setting can be realized by employing the configuration according to the third modification of the seventh embodiment, for example.

In this first example, the first floating gate 112 can be partially formed of metal material, similarly to the third modification. With this arrangement, the first example can achieve the same advantages as those of the first embodiment, similarly to the third modification. More specifically, the charge retention characteristics of the cell transistors can be improved, while the writing speed and the erasing speed can be made higher. Furthermore, the number of times that writing and erasing can be repeated can be increased.

In the second example of this embodiment, the work function of the material forming the upper surface of the second floating gate 114 is set at a different value from the work function of the material forming the lower surface of the second floating gate 114. This setting can be realized by employing the configuration according to the second modification of the seventh embodiment, for example.

In this second example, the second floating gate 114 can be partially formed of metal material, similarly to the second modification. With this arrangement, the second example can achieve the same advantages as those of the second embodiment, similarly to the second modification. More specifically, the charge retention characteristics of the cell transistors can be improved, while the writing speed can be made higher. Furthermore, the number of times that writing and erasing can be repeated can be increased.

In the third example of this embodiment, the first example and the second example are combined. More specifically, the work function of the material forming the upper surface of the first floating gate 112 is set at a different value from the work function of the material forming the lower surface of the first floating gate 112, and the work function of the material forming the upper surface of the second floating gate 114 is set at a different value from the work function of the material forming the lower surface of the second floating gate 114. This setting can be realized by employing the configuration according to the first modification of the seventh embodiment, for example.

In this third example, each of the first and second floating gates 112 and 114 can be partially formed of metal material, similarly to the first modification. With this arrangement, the third example can achieve the same advantages as those of the third embodiment, similarly to the first modification. More specifically, the charge retention characteristics of the cell transistors can be improved, while the writing speed and the erasing speed can be made higher than those in the first and second examples. Furthermore, the number of times that writing and erasing can be repeated can be increased.

As described above, in the first to eighth embodiments of the present invention, the floating gate of each cell transistor is formed with the first and second floating gates 112 and 114, and the second tunneling insulator 113 serving as an F-N tunneling film is formed between the first floating gate 112 and the second floating gate 114. Further, at least one of the first and second floating gates 112 and 114 includes a metal layer. With this arrangement, the charge retention characteristics of the cell transistors can be improved, while the writing speed and/or the erasing speed can be made higher.

As described above, the embodiments of the present invention can provide a semiconductor memory device that can improve the charge retention characteristics of the cell transistors while increasing the writing speed and/or the erasing speed.

Although specific examples of the present invention have been described in the first to eighth embodiments, the present invention is not limited to those embodiments.

The invention claimed is:
1. A semiconductor memory device comprising:
a substrate;
a first gate insulator formed on the substrate and serving as an F-N (Fowler-Nordheim) tunneling film;
a first floating gate formed on the first gate insulator;
a second gate insulator formed on the first floating gate and serving as an F-N tunneling film;
a second floating gate formed on the second gate insulator;
an intergate insulator formed on the second floating gate and serving as a charge blocking film; and
a control gate formed on the intergate insulator,
wherein
at least one of the first and second floating gates includes a metal layer, and
a work function of material forming a lower surface of the second floating gate is higher than a work function of material forming an upper surface of the first floating gate.
2. The device according to claim 1, wherein
the first floating gate is formed of metal material, and the second floating gate is formed of polysilicon.
3. The device according to claim 1, wherein
the first floating gate is formed of polysilicon, and the second floating gate is formed of metal material.
4. The device according to claim 3, wherein
a work function of the metal material forming the second floating gate is higher than a work function of the polysilicon.
5. The device according to claim 3, wherein
a work function of the metal material forming the second floating gate is higher than 4.1 eV.

6. The device according to claim 1, wherein each of the first and second floating gates is formed of metal material.

7. The device according to claim 1, wherein the first floating gate includes a plurality of layers, and an uppermost layer of the first floating gate is formed of metal material.

8. The device according to claim 1, wherein the second floating gate includes a plurality of layers, and a lowermost layer of the second floating gate is formed of metal material.

9. The device according to claim 1, wherein each of the first and second floating gates includes a plurality of layers, and each of an uppermost layer of the first floating gate and a lowermost layer of the second floating gate is formed of metal material.

10. The device according to claim 1, wherein the first floating gate is fully or partially silicided.

11. The device according to claim 1, wherein the second floating gate is fully or partially silicided.

12. The device according to claim 1, wherein a work function of material forming an upper surface of the first floating gate is different from a work function of material forming a lower surface of the first floating gate.

13. The device according to claim 1, wherein a work function of material forming an upper surface of the second floating gate is different from a work function of material forming a lower surface of the second floating gate.

14. The device according to claim 1, wherein a thickness of the first gate insulator and a thickness of the second gate insulator is equal to or greater than 3 nm in equivalent silicon oxide thickness.

15. The device according to claim 1, further comprising:
a plurality of bitlines extending in a first direction parallel to a surface of the substrate;
a plurality of wordlines extending in a second direction parallel to the surface of the substrate; and
a plurality of cell transistors, each of which includes the first gate insulator, the first floating gate, the second gate insulator, the second floating gate, the intergate insulator, and the control gate, and is electrically connected to one of the bitlines and one of the wordlines,
wherein the intergate insulator and the control gate are shared by the cell transistors adjacent to one another in a direction parallel to the wordlines.

16. The device according to claim 15, wherein a height of a lower surface of the control gate between the cell transistors is lower than a height of a lower surface of the control gate on the first and second floating gates.

17. The device according to claim 15, wherein a height of a lower surface of the control gate between the cell transistors is substantially equal to a height of a lower surface of the control gate on the first and second floating gates.

* * * * *